United States Patent
Gao et al.

(10) Patent No.: US 12,009,338 B2
(45) Date of Patent: Jun. 11, 2024

(54) DIMENSION COMPENSATION CONTROL FOR DIRECTLY BONDED STRUCTURES

(71) Applicant: ADEIA SEMICONDUCTOR BONDING TECHNOLOGIES INC., San Jose, CA (US)

(72) Inventors: Guilian Gao, San Jose, CA (US); Laura Wills Mirkarimi, Sunol, CA (US); Gaius Gillman Fountain, Jr., Youngsville, NC (US); Cyprian Emeka Uzoh, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 182 days.

(21) Appl. No.: 17/206,725

(22) Filed: Mar. 19, 2021

(65) Prior Publication Data

US 2021/0296282 A1    Sep. 23, 2021

Related U.S. Application Data

(60) Provisional application No. 62/991,775, filed on Mar. 19, 2020.

(51) Int. Cl.
*H01L 23/00* (2006.01)

(52) U.S. Cl.
CPC .............. *H01L 24/80* (2013.01); *H01L 24/08* (2013.01); *H01L 2224/08145* (2013.01);
(Continued)

(58) Field of Classification Search
CPC ..... H01L 24/08–89; H01L 2224/80896; H01L 2224/80895; H01L 2224/80143; H01L 2224/80031; H01L 2224/08145
See application file for complete search history.

(56) References Cited

U.S. PATENT DOCUMENTS

| 3,175,025 A | 3/1965 | Geen et al. |
| 3,423,823 A | 1/1969 | Ansley |

(Continued)

FOREIGN PATENT DOCUMENTS

| EP | 0823780 A1 | 2/1998 |
| EP | 0616426 B1 | 9/1998 |

(Continued)

OTHER PUBLICATIONS

Shen et al., "Structure and magnetic properties of Ce-substituted yttrium iron garnet prepared by conventional sintering techniques," J Supercond, 2017, pp. 937.

(Continued)

*Primary Examiner* — Hoa B Trinh
(74) *Attorney, Agent, or Firm* — Knobbe, Martens, Olson & Bear LLP

(57) ABSTRACT

A method of direct hybrid bonding first and second semiconductor elements of differential thickness is disclosed. The method can include patterning a plurality of first contact features on the first semiconductor element. The method can include second a plurality of second contact features on the second semiconductor element corresponding to the first contact features for direct hybrid bonding. The method can include applying a lithographic magnification correction factor to one of the first patterning and second patterning without applying the lithographic magnification correction factor to the other of the first patterning and the second patterning. In various embodiments, a differential expansion compensation structure can be disposed on at least one of the first and the second semiconductor elements. The differential expansion compensation structure can be configured to compensate for differential expansion between the first and second semiconductor elements to reduce misalignment between at least the second and fourth contact features.

20 Claims, 18 Drawing Sheets

(52) U.S. Cl.
CPC .............. *H01L 2224/80031* (2013.01); *H01L 2224/80143* (2013.01); *H01L 2224/80895* (2013.01); *H01L 2224/80896* (2013.01)

(56) References Cited

U.S. PATENT DOCUMENTS

| | | | |
|---|---|---|---|
| 4,612,083 A | 9/1986 | Yasumoto et al. | |
| 4,818,728 A | 4/1989 | Rai et al. | |
| 5,451,547 A | 9/1995 | Himi et al. | |
| 5,668,057 A | 9/1997 | Eda et al. | |
| 5,747,857 A | 5/1998 | Eda et al. | |
| 5,753,536 A | 5/1998 | Sugiyama et al. | |
| 5,771,555 A | 6/1998 | Eda et al. | |
| 5,773,836 A * | 6/1998 | Hartley | G03F 7/70425 250/491.1 |
| 6,080,640 A | 6/2000 | Gardner et al. | |
| 6,180,496 B1 | 1/2001 | Farrens et al. | |
| 6,423,640 B1 | 7/2002 | Lee et al. | |
| 6,465,892 B1 | 10/2002 | Suga | |
| 6,495,398 B1 | 12/2002 | Goetz | |
| 6,502,271 B1 | 1/2003 | Epshteyn | |
| 6,645,828 B1 | 11/2003 | Farrens et al. | |
| 6,877,209 B1 | 4/2005 | Miller et al. | |
| 6,887,769 B2 | 5/2005 | Kellar et al. | |
| 6,908,027 B2 | 6/2005 | Tolchinsky et al. | |
| 6,908,832 B2 | 6/2005 | Farrens et al. | |
| 7,037,804 B2 | 5/2006 | Kellar et al. | |
| 7,045,453 B2 | 5/2006 | Canaperi et al. | |
| 7,105,980 B2 | 9/2006 | Abbott et al. | |
| 7,109,092 B2 | 9/2006 | Tong | |
| 7,126,212 B2 | 10/2006 | Enquist et al. | |
| 7,192,841 B2 | 3/2007 | Wei et al. | |
| 7,193,423 B1 | 3/2007 | Dalton et al. | |
| 7,213,314 B2 | 5/2007 | Abbott et al. | |
| 7,230,512 B1 | 6/2007 | Carpenter et al. | |
| 7,335,572 B2 | 2/2008 | Tong et al. | |
| 7,466,022 B2 | 12/2008 | Miller et al. | |
| 7,602,070 B2 | 10/2009 | Tong et al. | |
| 7,750,488 B2 | 7/2010 | Patti et al. | |
| 7,803,693 B2 | 9/2010 | Trezza | |
| 8,035,464 B1 | 10/2011 | Abbott et al. | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,735,219 B2 | 5/2014 | Enquist et al. | |
| 8,802,538 B1 | 8/2014 | Liu | |
| 8,809,123 B2 | 8/2014 | Liu et al. | |
| 8,975,158 B2 | 3/2015 | Plach et al. | |
| 8,988,299 B2 | 3/2015 | Kam et al. | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,368,866 B2 | 6/2016 | Yu | |
| 9,385,024 B2 | 7/2016 | Tong et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,698,126 B2 | 7/2017 | Enquist et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,881,882 B2 | 1/2018 | Hsu et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,177,735 B2 | 1/2019 | Ruby et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,454,447 B2 | 10/2019 | Solal et al. | |
| 10,508,030 B2 | 12/2019 | Katkar et al. | |
| 10,522,499 B2 | 12/2019 | Enquist et al. | |
| 10,707,087 B2 | 7/2020 | Uzoh et al. | |
| 10,727,219 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,606 B2 | 10/2021 | Gao et al. | |
| 11,171,117 B2 | 11/2021 | Gao et al. | |
| 11,176,450 B2 | 11/2021 | Teig et al. | |
| 11,222,863 B2 | 1/2022 | Hua et al. | |
| 11,256,004 B2 | 2/2022 | Haba et al. | |
| 11,264,357 B1 | 3/2022 | DeLaCruz et al. | |
| 11,276,676 B2 | 3/2022 | Enquist et al. | |
| 11,329,034 B2 | 5/2022 | Tao et al. | |
| 11,348,898 B2 | 5/2022 | DeLaCruz et al. | |
| 11,355,443 B2 | 6/2022 | Huang et al. | |
| 11,631,586 B2 | 4/2023 | Enquist et al. | |
| 11,664,357 B2 | 5/2023 | Fountain, Jr. et al. | |
| 2001/0037995 A1 | 11/2001 | Akatsu et al. | |
| 2002/0030198 A1 | 3/2002 | Coman et al. | |
| 2002/0048900 A1 | 4/2002 | Lo et al. | |
| 2002/0068396 A1 | 6/2002 | Fitzgerald | |
| 2003/0022412 A1 | 1/2003 | Higgins et al. | |
| 2003/0030119 A1 | 2/2003 | Higgins, Jr. et al. | |
| 2004/0084414 A1 | 5/2004 | Sakai et al. | |
| 2006/0057945 A1 | 3/2006 | Hsu et al. | |

(56) References Cited

U.S. PATENT DOCUMENTS

| | | |
|---|---|---|
| 2006/0076559 A1 | 4/2006 | Faure et al. |
| 2006/0121696 A1 | 6/2006 | Shiota et al. |
| 2006/0138907 A1 | 6/2006 | Koizumi et al. |
| 2006/0199353 A1 | 9/2006 | Kub et al. |
| 2006/0255341 A1 | 11/2006 | Pinnington et al. |
| 2006/0273068 A1 | 12/2006 | Maunand Tussot et al. |
| 2006/0284167 A1 | 12/2006 | Augustine et al. |
| 2007/0096294 A1 | 5/2007 | Ikeda et al. |
| 2007/0111386 A1 | 5/2007 | Kim et al. |
| 2007/0222048 A1 | 9/2007 | Huang |
| 2007/0295456 A1 | 12/2007 | Gudeman et al. |
| 2008/0061291 A1* | 3/2008 | Dusa ............... G03F 7/70658 257/48 |
| 2009/0004822 A1 | 1/2009 | Murakami et al. |
| 2009/0042356 A1 | 2/2009 | Takayama et al. |
| 2009/0068831 A1 | 3/2009 | Enquist et al. |
| 2009/0191719 A1 | 7/2009 | Dupont |
| 2009/0321869 A1 | 12/2009 | Fukuoka et al. |
| 2011/0053339 A1 | 3/2011 | Ozawa |
| 2011/0128399 A1 | 6/2011 | Fujii |
| 2011/0290552 A1 | 12/2011 | Palmateer et al. |
| 2012/0003813 A1 | 1/2012 | Chuang et al. |
| 2012/0028440 A1 | 2/2012 | Castex et al. |
| 2012/0077329 A1* | 3/2012 | Broekaart ............ H01L 21/187 438/455 |
| 2012/0119224 A1 | 5/2012 | Tai et al. |
| 2012/0132922 A1 | 5/2012 | Arena et al. |
| 2012/0168792 A1 | 7/2012 | Kang et al. |
| 2012/0183808 A1 | 7/2012 | Tong |
| 2012/0212384 A1 | 8/2012 | Kam et al. |
| 2012/0270231 A1 | 10/2012 | Smith et al. |
| 2013/0130473 A1 | 5/2013 | Ben Mohamed et al. |
| 2013/0228775 A1 | 9/2013 | Noda et al. |
| 2014/0167230 A1 | 6/2014 | Kitada et al. |
| 2014/0175655 A1 | 6/2014 | Chen et al. |
| 2014/0225795 A1 | 8/2014 | Yu |
| 2015/0064498 A1 | 3/2015 | Tong |
| 2015/0097022 A1 | 4/2015 | Di Cioccio et al. |
| 2016/0049384 A1 | 2/2016 | Lu et al. |
| 2016/0181228 A1 | 6/2016 | Higuchi et al. |
| 2016/0343682 A1 | 11/2016 | Kawasaki |
| 2017/0036419 A1 | 2/2017 | Adib et al. |
| 2017/0194271 A1 | 7/2017 | Hsu et al. |
| 2017/0338143 A1 | 11/2017 | Peidous et al. |
| 2018/0068965 A1 | 3/2018 | Chen et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0115277 A1 | 4/2019 | Yu et al. |
| 2019/0123709 A1 | 4/2019 | Inoue et al. |
| 2019/0131277 A1 | 5/2019 | Yang et al. |
| 2019/0157333 A1 | 5/2019 | Tsai |
| 2019/0164919 A1 | 5/2019 | Hu et al. |
| 2019/0170631 A1 | 6/2019 | Shachar et al. |
| 2019/0198409 A1 | 6/2019 | Katkar et al. |
| 2019/0221607 A1 | 7/2019 | Gudeman |
| 2019/0265411 A1 | 8/2019 | Huang et al. |
| 2019/0288660 A1 | 9/2019 | Goto et al. |
| 2019/0295883 A1 | 9/2019 | Yokokawa |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0006145 A1 | 1/2020 | Li et al. |
| 2020/0006266 A1 | 1/2020 | Chen et al. |
| 2020/0013637 A1 | 1/2020 | Haba |
| 2020/0013765 A1 | 1/2020 | Fountain, Jr. et al. |
| 2020/0028486 A1 | 1/2020 | Kishino et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0328193 A1 | 10/2020 | Enquist et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0005784 A1 | 1/2022 | Gao et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207322 A1 | 6/2023 | Enquist et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0253383 A1 | 8/2023 | Fountain, Jr. et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |

(56) References Cited

U.S. PATENT DOCUMENTS

| | | |
|---|---|---|
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0079376 A1 | 3/2024 | Suwito et al. |

FOREIGN PATENT DOCUMENTS

| | | |
|---|---|---|
| EP | 0591918 B1 | 7/1999 |
| EP | 3 482 231 B1 | 9/2022 |
| FR | 2 849 268 | 6/2004 |
| JP | 2011-200933 | 10/2011 |
| JP | 2013-33786 | 2/2013 |
| JP | 2018-160519 | 10/2018 |
| KR | 10-2015-0097798 | 8/2015 |
| KR | 10-2018-0114896 | 10/2018 |
| WO | WO 2005/043584 A2 | 5/2005 |
| WO | WO 2006/100444 A1 | 9/2006 |
| WO | WO 2015/191082 A1 | 12/2015 |
| WO | WO 2017/151442 A1 | 9/2017 |
| WO | WO 2019/180922 A1 | 9/2019 |

OTHER PUBLICATIONS

Vasili et al., "Direct observation of multivalent states and 4 f-3d charge transfer in Ce-doped yttrium iron garnet thin films," Physical Review, 2017, pp. 1-10.

International Search Report and Written Opinion dated Jul. 12, 2021, in International Application No. PCT/US2021/023048, 9 pages.

Taylor, S. et al., "A review of the plasma oxidation of silicon and its applications," Semicond. Sci. Technol., 1993, vol. 8, pp. 1426-1433.

Amirfeiz et al., "Formation of silicon structures by plasma-activated wafer bonding," Journal of The Electrochemical Society, 2000, vol. 147, No. 7, pp. 2693-2698.

Bengtsson, S. et al., "Low Temperature Bonding," International Conference on Compliant & Alternative Substrate Technology, Meeting Program & Abstract Book, Sep. 29-23, p. 10.

Farrens et al., "Chemical Free Room Temperature Wafer to Wafer Direct Bonding", J. Electrochem. Soc., vol. 142, No. 11, Nov. 1995, pp. 3949-3955.

Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.

Gösele, U. et al., "Semiconductor Wafer Bonding, a Flexible Approach to Materials Combinations in Microelectronics, Micromechanics and Optoelectronics", 1997 IEEE, pp. 23-32.

International Search Report and Written Opinion dated Feb. 7, 2014 in PCT/US2013/057536 filed Aug. 30, 2013.

International Search Report and Written Opinion dated Mar. 7, 2019, in International Application No. PCT/US2018/060044, 14 pages.

International Search Report and Written Opinion dated Apr. 22, 2019 in International Application No. PCT/US2018/064982, 13 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

Reiche et al., "The effect of a plasma pretreatment on the Si/Si bonding behaviouir," Electrochemical Society Proceedings, 1998, vol. 97-36, pp. 437-444.

Darling, R.B., "Wafer Bonding," EE-527: Microfabrication, Winter 2013, 32 pages.

Mizumoto et al., Direct wafer bonding and its application to waveguide optical isolators, Department of Electrical and Electronic Engineering, Tokyo Institute of Technology, Materials, ISSN: 1996-1944, www.mdpi.com/journal/materials, Mar. 31, 2012, pp. 985-1004.

Suga et al., "Combined process for wafer direct bonding by means of the surface activation method," IEEE, 2004, pp. 484-490.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takei et al., "Effects of wafer precleaning and plasma irradiation to wafer surfaces on plasma-assisted surface-activated direct bonding," Japanese Journal of Applied Physics, 2010, vol. 49, pp. 1-3.

"Wafer Bonding—An Overview," ScienceDirect Topics, Journals & Books, https://www.sciencedirect.com/topics/engineering/wafer-bonding, printed Jun. 27, 2019, 12 pages.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "Onsemi AR0820.".

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image.".

* cited by examiner

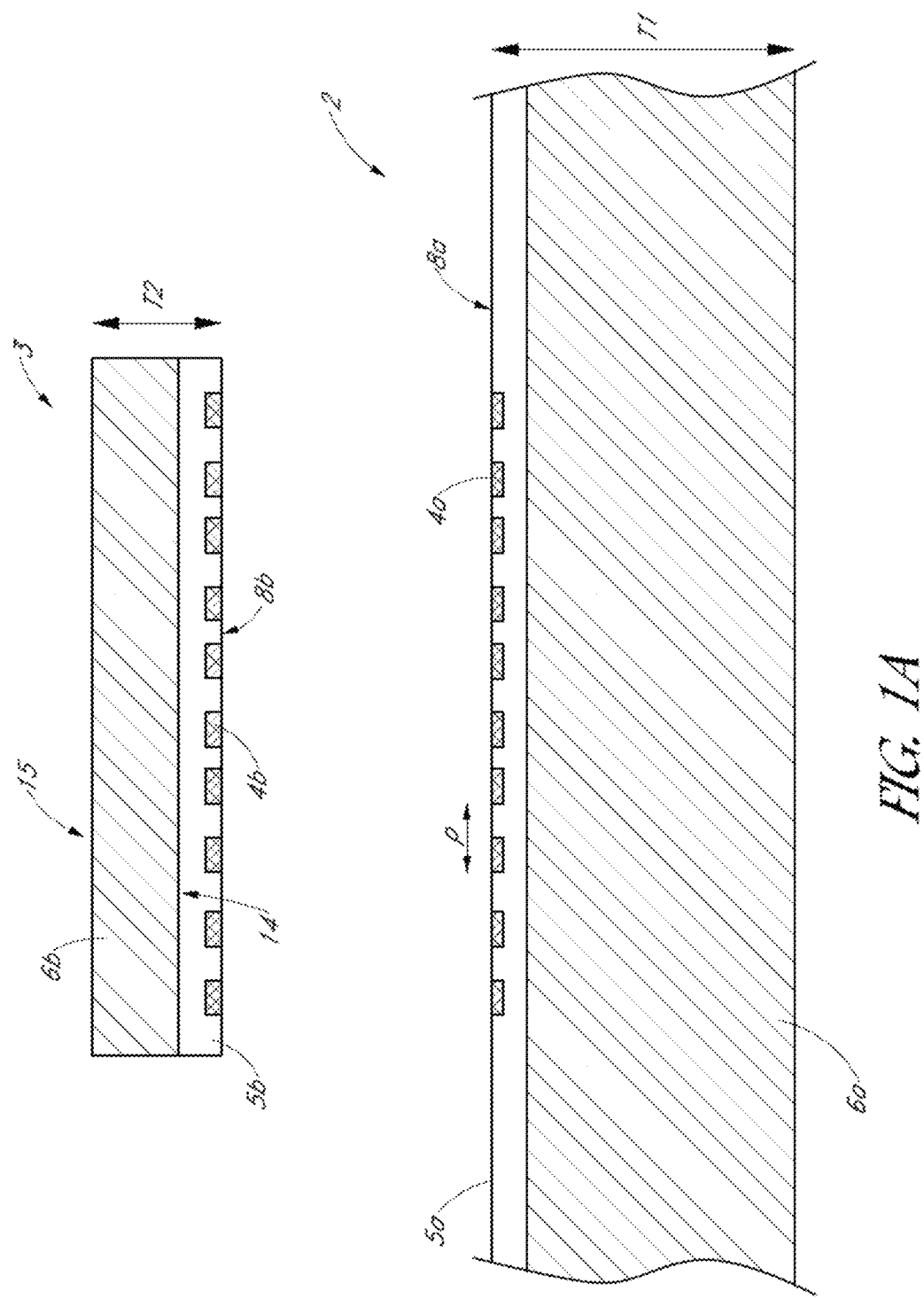

| Die thickness (um) | Die growth on 13mm diagonal die (nm) | percentage | Correction factor for shrinking die |
|---|---|---|---|
| 800 | 0 | 0 | 1 |
| 600 | 5.8 | 4.46154E-05 | 0.99999772 |
| 400 | 29 | 0.000223077 | 0.99999281 |
| 300 | 93 | 0.000715385 | 0.99996359 |
| 200 | 473 | 0.003638462 | 0.99941797 |

| Die thickness (um) | Die growth on 13mm diagonal die (nm) | percentage | Correction factor for enlarging host wafer die size |
|---|---|---|---|
| 800 | 0 | 0 | 1 |
| 600 | 5.8 | 4.46154E-05 | 0.99999772 |
| 400 | 29 | 0.000223077 | 0.99999281 |
| 300 | 93 | 0.000715385 | 0.99996359 |
| 200 | 473 | 0.003638462 | 0.99941797 |

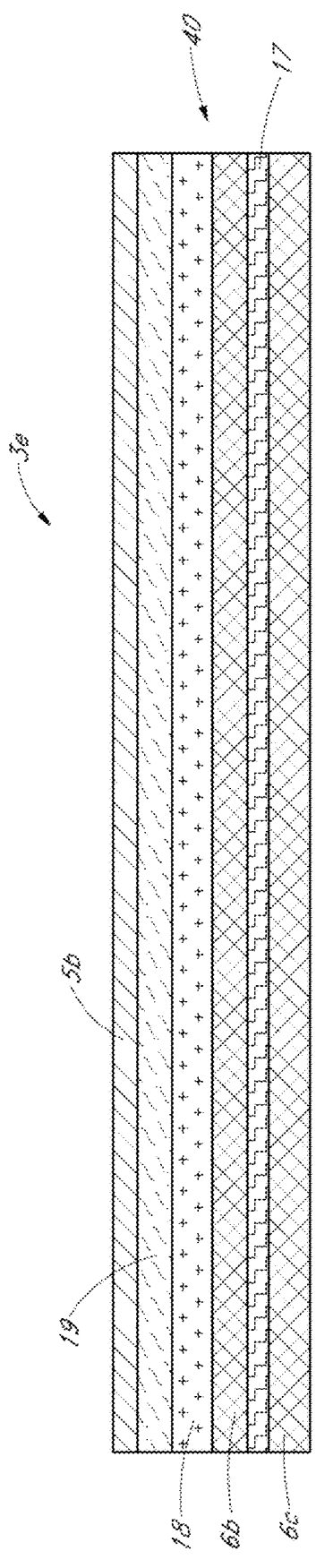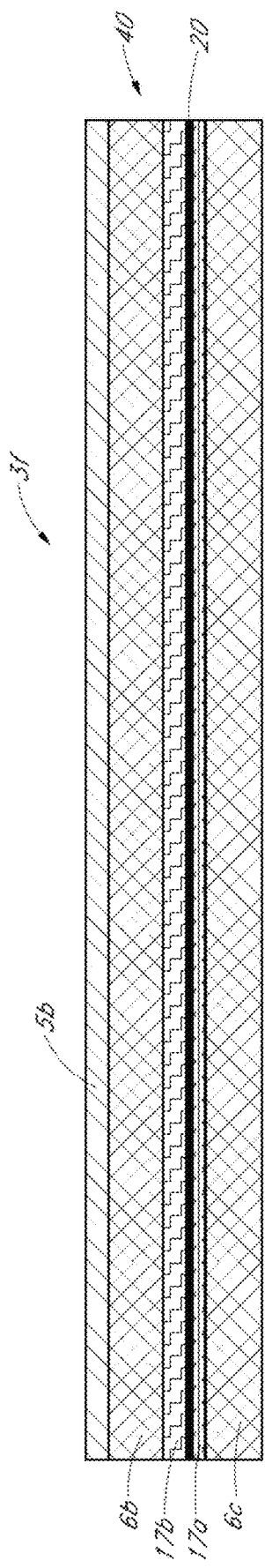
FIG. 6C
FIG. 6D

DIMENSION COMPENSATION CONTROL FOR DIRECTLY BONDED STRUCTURES

INCORPORATION BY REFERENCE TO ANY PRIORITY APPLICATIONS

This application claims priority to U.S. Provisional Patent Application No. 62/991,775, filed Mar. 19, 2020, the entire contents of which are hereby incorporated by reference in their entirety and for all purposes.

BACKGROUND

Field of the Invention

The field relates to dimension compensation control for directly bonded structures.

Description of the Related Art

Semiconductor elements, such as semiconductor wafers or integrated device dies, can be stacked and directly bonded to one another without an adhesive. For example, in some hybrid direct bonded structures, nonconductive field regions of the elements can be directly bonded to one another, and corresponding conductive contact structures can be directly bonded to one another. In some applications, it can be challenging to create reliable electrical connections between opposing contact pads, particularly for finely pitched contact pads. Accordingly, there remains a continuing need for improved contact structures for direct bonding.

BRIEF DESCRIPTION OF THE DRAWINGS

Specific implementations will now be described with reference to the following drawings, which are provided by way of example, and not limitation.

FIG. 1A is a schematic side sectional view of first and second elements prior to direct bonding, according to various embodiments.

FIG. 6C is a schematic side view of the second element that includes a differential expansion compensation structure comprising an embedded dielectric layer and compound semiconductor layer.

FIG. 6D is a schematic side view of the second element that includes a differential expansion compensation structure comprising an embedded metal layer and a plurality of embedded dielectric layer.

DETAILED DESCRIPTION

Figure 1B:
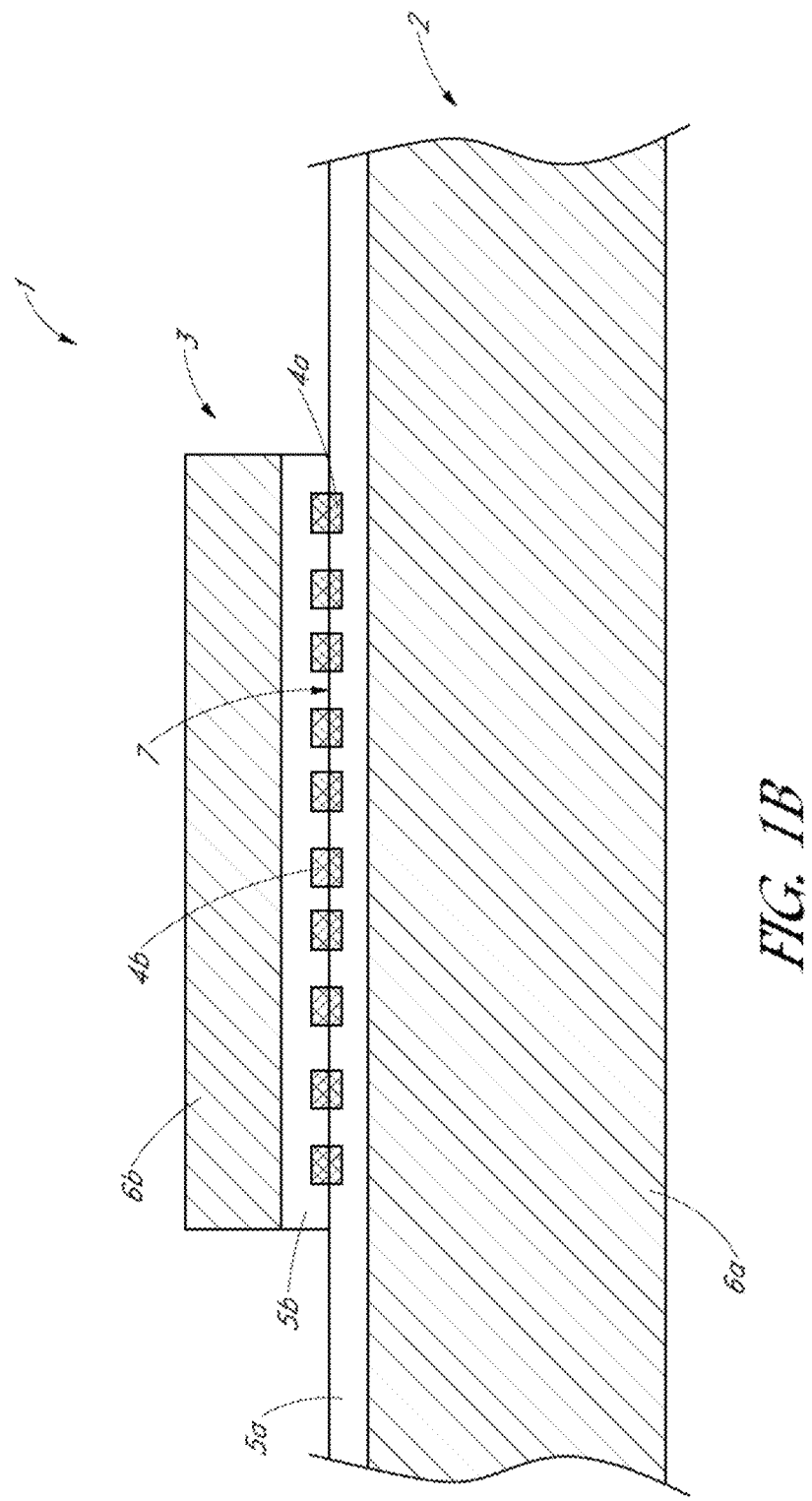
FIG. 1B is a schematic side sectional view of a directly bonded structure in which the first and second elements of FIG. 1A are directly bonded to one another without an intervening adhesive.

Various embodiments disclosed herein relate to directly bonded structures 1 in which two elements 2, 3 can be directly bonded to one another without an intervening adhesive. Two or more semiconductor elements (such as integrated device dies, wafers, etc.) 2, 3 may be stacked on or bonded to one another to form a bonded structure 1. Conductive contact pads 4a of a first element 2 may be electrically connected to corresponding conductive contact pads 4b of a second element 3. Any suitable number of elements can be stacked in the bonded structure 1. For example, a third element (not shown) can be stacked on the second element 3, a fourth element (not shown) can be stacked on the third element, etc. Additionally or alternatively, one or more additional elements (not shown) can be stacked laterally adjacent one another along the first element 1.

In some embodiments, the elements 2, 3 are directly bonded to one another without an adhesive. In various embodiments, a non-conductive or dielectric material can serve as a first bonding layer 5a of the first element 2 which can be directly bonded to a corresponding non-conductive or dielectric field region serving as a second bonding layer 5b of the second element 3 without an adhesive. The nonconductive bonding layers 5a, 5b can be disposed on respective front sides 14 of device portions 6a, 6b, such as a semiconductor (e.g., silicon) portion of the elements 2, 3. Active devices and/or circuitry can be patterned and/or otherwise disposed in or on the device portions 6a, 6b. Active devices and/or circuitry can be disposed at or near the front sides 14 of the device portions 6a, 6b, and/or at or near opposite back sides 15 of the device portions 6a, 6b. The non-conductive material can be referred to as a nonconductive bonding region or bonding layer 5a of the first element 2. In some embodiments, the non-conductive bonding layer 5a of the first element 2 can be directly bonded to the corresponding non-conductive bonding layer 5b of the second element 3 using dielectric-to-dielectric bonding techniques. For example, nonconductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiment, the bonding layers 5a and/or 5b can comprise a nonconductive materials such as a dielectric material, such as silicon oxide, or an undoped semiconductor material, such as undoped silicon.

In various embodiments, direct hybrid bonds can be formed without an intervening adhesive. For example, dielectric bonding surfaces 8a, 8b can be polished to a high degree of smoothness. The bonding surfaces 8a, 8b can be cleaned and exposed to a plasma and/or etchants to activate the surfaces 8a, 8b. In some embodiments, the surfaces 8a, 8b can be terminated with a species after activation or during activation (e.g., during the plasma and/or etch processes). Without being limited by theory, in some embodiments, the activation process can be performed to break chemical bonds at the bonding surface 8a, 8b, and the termination process can provide additional chemical species at the bonding surface 8a, 8b that improves the bonding energy during direct bonding. In some embodiments, the activation and termination are provided in the same step, e.g., a plasma or wet etchant to activate and terminate the surfaces 8a, 8b. In other embodiments, the bonding surface 8a, 8b can be terminated in a separate treatment to provide the additional species for direct bonding. In various embodiments, the terminating species can comprise nitrogen. Further, in some embodiments, the bonding surfaces 8a, 8b can be exposed to fluorine. For example, there may be one or multiple fluorine peaks near layer and/or bonding interfaces 7. Thus, in the directly bonded structures 1, the bonding interface 7 between two nonconductive materials (e.g., the bonding layers 5a, 5b) can comprise a very smooth interface with higher nitrogen content and/or fluorine peaks at the bonding interface 7. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads 4a of the first element 2 can also be directly bonded to corresponding conductive contact pads 4b of the second element 3. For example, a hybrid bonding technique can be used to provide conductor-to-conductor direct bonds along the bond interface 7 that includes covalently direct bonded nonconductive-to-nonconductive (e.g., dielectric-to-dielectric) surfaces, prepared as described above. In various embodiments, the conductor-to-conductor (e.g., contact pad 4a to contact pad 4b) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, nonconductive (e.g., dielectric) bonding surfaces 8a, 8b can be prepared and directly bonded to one another without an intervening adhesive as explained above. Conductive contact pads 4a, 4b (which may be surrounded by nonconductive dielectric field regions within the bonding layers 5a, 5b) may also directly bond to one another without an intervening adhesive. In some embodiments, the respective contact pads 4a, 4b can be recessed below exterior (e.g., upper) surfaces 5a, 5b of the dielectric field or nonconductive bonding layers 5a, 5b, for example, recessed by less than 30 nm, less than 20 nm, less than 15 nm, or less than 10 nm, for example, recessed in a range of 2 nm to 20 nm, or in a range of 4 nm to 10 nm. The nonconductive bonding layers 5a, 5b can be directly bonded to one another without an adhesive at room temperature in some embodiments and, subsequently, the bonded structure 1 can be annealed. Upon annealing, the contact pads 4a, 4b can expand and contact one another to form a metal-to-metal direct bond. Beneficially, the use of Direct Bond Interconnect, or DBI®, techniques commercially available from Xperi of San Jose, CA, can enable high density of pads 4a, 4b connected across the direct bond interface 7 (e.g., small or fine pitches for regular arrays). In some embodiments, the pitch of the bonding pads 4a, 4b, or conductive traces embedded in the bonding surface of one of the bonded elements, may be less than 40 microns or less than 10 microns or even less than 2 microns. For some applications the ratio of the pitch of the bonding pads 4a, 4b to one of the dimensions (e.g., a diameter) of the bonding pad is less than 5, or less than 3 and sometimes desirably less than 2. In other applications the width of the conductive traces embedded in the bonding surface of one of the bonded elements may range between 0.3 to 3 microns. In various embodiments, the contact pads 4a, 4b and/or traces can comprise copper, although other metals may be suitable.

Thus, in direct bonding processes, a first element 2 can be directly bonded to a second element 3 without an intervening adhesive. In some arrangements, the first element 2 can comprise a singulated element, such as a singulated integrated device die. In other arrangements, as shown in FIGS. 1A-1B, the first element 2 can comprise a carrier or substrate (e.g., a wafer) that includes a plurality (e.g., tens, hundreds, or more) of device regions that, when singulated, form a plurality of integrated device dies. Similarly, the second element 3 can comprise a singulated element, such as a singulated integrated device die, as shown in FIGS. 1A-1B. In other arrangements, the second element 3 can comprise a carrier or substrate (e.g., a wafer).

As explained herein, the first and second elements 2, 3 can be directly bonded to one another without an adhesive, which is different from a deposition process. In one application, a width of the first element 2 in the bonded structure is similar to a width of the second element 3. In some other embodiments, a width of the first element 2 in the bonded structure 1 is different from a width of the second element 3. Similarly, the width or area of the larger element in the bonded structure may be at least 10% larger than the width or are of the smaller element. The first and second elements 2, 3 can accordingly comprise non-deposited elements. Further, directly bonded structures 1, unlike deposited layers, can include a defect region along the bond interface 7 in which nanovoids are present. The nanovoids may be formed due to activation of the bonding surfaces 8a, 8b (e.g., exposure to a plasma). As explained above, the bond interface 7 can include concentration of materials from the activation and/or last chemical treatment processes. For example, in embodiments that utilize a nitrogen plasma for activation, a nitrogen peak can be formed at the bond interface 7. In embodiments that utilize an oxygen plasma for activation, an oxygen peak can be formed at the bond interface 7. In some embodiments, the bond interface 7 can comprise silicon oxynitride, silicon oxycarbonitride, or silicon carbonitride. As explained herein, the direct bond can comprise a covalent bond, which is stronger than van Der Waals bonds. The bonding layers 5a, 5b can also comprise polished surfaces that are planarized to a high degree of smoothness.

In various embodiments, the metal-to-metal bonds between the contact pads 4a, 4b can be joined such that copper grains grow into each other across the bond interface 7. In some embodiments, the copper can have grains oriented along the 111 crystal plane for improved copper diffusion across the bond interface 7. The bond interface 7 can extend substantially entirely to at least a portion of the bonded contact pads 4a, 4b, such that there is substantially no gap between the nonconductive bonding layers 5a, 5b at or near the bonded contact pads 4a, 4b. In some embodiments, a barrier layer may be provided under the contact pads 4a, 4b (e.g., which may include copper). In other embodiments, however, there may be no barrier layer under the contact pads 4a, 4b, for example, as described in U.S. 2019/0096741, which is incorporated by reference herein in its entirety and for all purposes.

Beneficially, the use of the hybrid bonding techniques described herein can enable extremely fine pitch between adjacent contact pads 4a or 4b, and/or small pad sizes. For example, in various embodiments, the pitch p (see FIG. 1A) between adjacent pads 4a (or 4b) can be in a range of 0.5 microns to 25 microns, in a range of 0.75 microns to 25 microns, in a range of 1 micron to 25 microns, in a range of 1 micron to 10 microns, or in a range of 1 micron to 5 microns. Further a major lateral dimension (e.g., a pad diameter) can be small as well, e.g., in a range of 0.25 microns to 8 microns, in a range of 0.25 microns to 5 microns, or in a range of in a range of 0.5 microns to 5 microns. For directly bonded structures 1 that utilize such fine pitches and/or small pad sizes, it can be particularly challenging to ensure that all (or substantially all) of the contact pads 4a, 4b on the elements 2, 3 are sufficiently aligned such that, when the elements 2, 3 are annealed, opposing contact pads 4a, 4b sufficiently laterally overlap so as to form a reliable electrical contact. If there is not sufficient lateral overlap between adjacent contact pads 4a, 4b, there may be little or no electrical communication between the pads 4a, 4b.

In some devices, the elements 2, 3 can have different respective thicknesses T1, T2. For example, in some embodiments, the first element 2 can have a first thickness T1 that is greater than a second thickness T2 of the second element 3. For example, in the illustrated embodiment, the first element 2 can comprise a substrate, such as a wafer, that has a thickness of at least 500 microns, at least 600 microns, at least 700 microns, or at least 750 microns e.g., about 725 microns or about 775 microns for a 300 mm wafer nominal thickness. In other embodiments, the second element 3 can have a greater thickness than the first element 2. In the arrangement of FIGS. 1A-1B, the second element 3 can comprise an integrated device die or chip that has been singulated from a second larger wafer. The second wafer can be thinned prior to bonding to form a thinned back side 15 of the second element 3 having the second thickness T2 which is less than the first thickness T1. In various embodiments, the second thickness T2 can be less than 725 microns, e.g., in a range of 50 microns to 725 microns, in a range of 50 microns to 500 microns, in a range of 50 microns to 250 microns, in a range of 50 microns to 100 microns, or in a range of 5 microns to 50 microns.

Figure 1C:
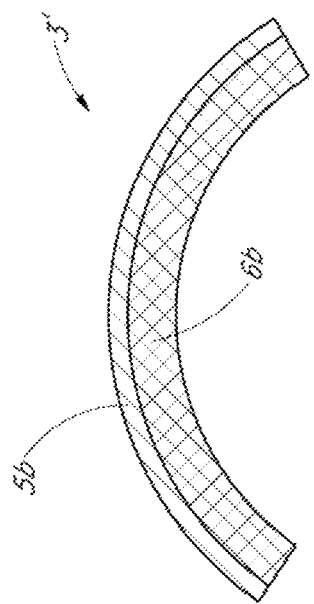
FIG. 1C is a schematic side view of a second element in wafer form which shows wafer warpage before thinning (left hand side) and after thinning (right hand side).
Figure 1C:
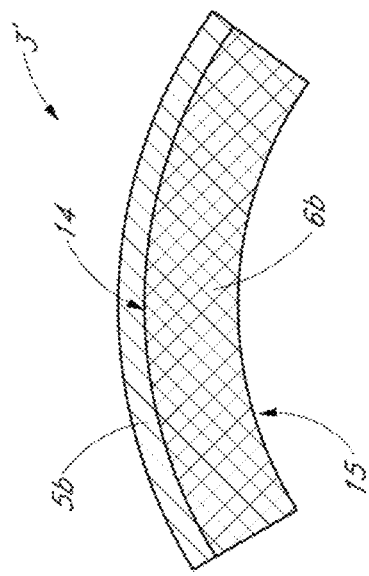

As shown in the left hand side of FIG. 1C, prior to thinning, the second element 3' in wafer form (e.g., prior to singulation into a plurality of dies 3) can be warped or bowed such that the second element 3' has a first curvature or bow. Without being limited by theory, residual stress in the bonding layer 5b can cause the bow. It should be appreciated that, in various embodiments, the bonding layer 5b illustrated herein can comprise one or multiple nonconductive layers, including back-end-of-line, or BEOL, layer(s). Thus, in some embodiments, the bonding layer 5b can comprise multiple layers including patterned traces and contact pads at the exterior surface. In FIG. 1C, the layer 5b can impart compressive stresses such that the front side 14 has a convex curvature and the back side 15 has a concave curvature. After singulation, the shape of the warpage of the singulated element 3 will generally be in the same orientation as the shape of warpage of the unsingulated element 3'. The height of the die's bow can be proportional to a height of the wafer's bow prior to singulation.

As shown in the right hand side of FIG. 1C, after the unsingulated element 3' has been thinned, the semiconductor or device portion 6b provides less mechanical resistance to the stress in the layer 5b, such that the compressive stresses increases the bow or warpage of the element 3' as compared to the bow or warpage prior to thinning. Moreover, the increased warpage can cause the element 3' in wafer form (and also the element 3 in singulated form) to stretch, including stretching of the semiconductor portion 6b and the layer 5b. Thus, after thinning, the element 3' in wafer form can slightly stretch in two dimensions. The element 3' in wafer form can be singulated into a plurality of singulated elements 3, which can be similarly stretched and/or bowed.

As explained herein, the residual stress in the layer 5b can cause the element 3' in wafer form to be bowed or warped. Compressive stresses in the bonding layer 5b can induce the curvature shown in FIG. 1C. Similarly, tensile stresses in the layer 5b can induce the opposite curvature, in which the front side 14 forms a concave bow and the back side 15 forms a convex bow. As explained herein, the warpage of the element 3' can stretch or expand the semiconductor portion 6b at submicron dimensions. This stretching of the element 3, referred to as runout, is typically dominated by bending when the stress in the layer 5b is relatively high and the second element 3 is thin, e.g., bending the bowed die to be flat during bonding stretches the die. However, multiple sources contribute to runout due to die bending. For example, the second element 3 can be deformed by the bonding tool that holds the element 3 prior to bonding. Further, the second element 3 can also be deformed during direct bonding. For example, in some cases, direct bonding can be performed such that a first region of the elements 2, 3 make contact before a second region. The direct bond can propagate from the first region to the second region. However, upon bond initiation, a thin air film may be trapped between the elements 2, 3. The propagation of the direct bond from the first region to the second region over the trapped air pocket may further deform the second element 3. The deformation can be affected by the wafer or die thickness, the bond energy, and the bond initiation force. For example, different surface treatments and/or smoothness can lead to higher bond energies that increase the bonding wave and can cause more stretching of the second element 3. Analytical or numerical models and experimental testing can be performed to account for these factors and predict the degree of stretching of the second element 3.

Figure 2A:
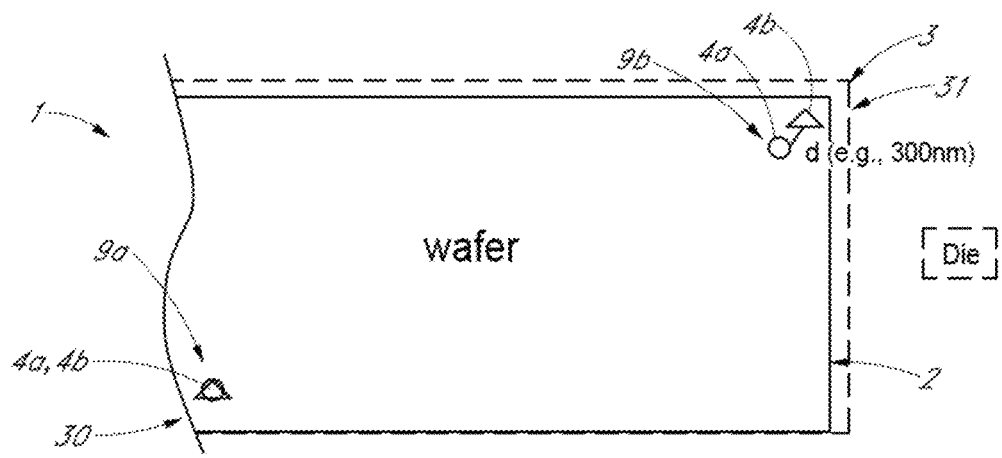
FIG. 2A is a top plan view of a bonded structure in which stretching of an integrated device die produces misalignment of contact pads in at least portion(s) of the bonded structure.
Figure 2B:
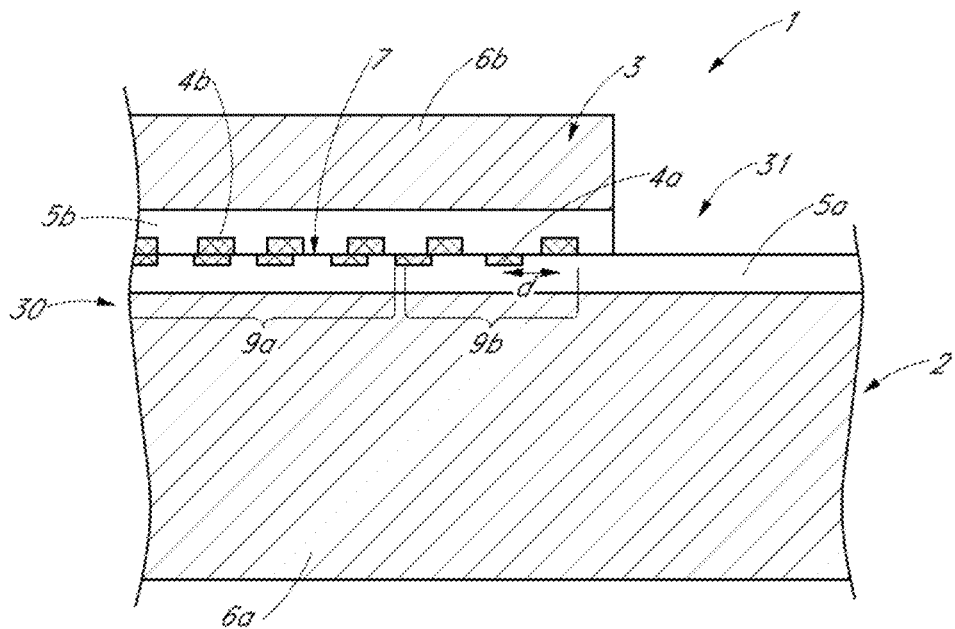
FIG. 2B is a schematic side sectional view of a portion of the bonded structure of FIG. 2A.

For example, as shown in FIGS. 2A and 2B, when a thinned singulated integrated device die (e.g., the second element 3) is directly bonded to a thicker wafer (e.g., the first element 2), the thinned second element 3 can be laterally stretched relative to the thicker second element 2. Due to the nature of the stretching, opposing contact pads 4a, 4b can be misaligned, particularly at a peripheral portion 31 of the second element 3 (e.g., at or near an edge of the die) as compared to an inner portion 30 of the second element 3. Misalignment of contact pads 4a, 4b may result in an ineffective electrical connection or no electrical connection at all. As an example, for direct bonding of 0.5 micron diameter pads, pad misalignment should be less than 200 nm for all interconnections in order to provide sufficient electrical contact.

As shown in FIGS. 2A-2B, opposing pads 4a, 4b at the peripheral portion 31 can comprise a misaligned pad pair 9b in which a center-to-center distance d between opposing pads 4a, 4b may exceed alignment tolerances. For example, for the die-to-wafer bonded structure 1 shown in FIGS. 2A-2B, the distance d for the misaligned pad pair 9b can be approximately 300 nm. The pads 4a, 4b of the misaligned pad pair 9b may not form an adequate electrical connection. Thus, as shown, the stress-induced stretching of the second element 3 can cause radial stretching from the center of the die, which may thereby be most pronounced at the diagonal positions, e.g., in a diagonally-oriented direction, because that direction is the longest distance to the location of first bond initiation. Such die growth can prevent adequate electrical contact. In some applications, misalignments on the order of 300 nm may be so small that the die growth does not affect device yield. For example, in packaging applications, the pitch may be at least 30 microns, such that submicron stretching does not appreciably affect alignment. However, due to the finely-pitched and small-size contact pads used in hybrid direct bonding applications, even small misalignments of this size can reduce device yield.

Although the pads 4a, 4b at the peripheral portion 31 are misaligned, other sets of pads 4a, 4b at an inner portion 30 of the second element 3 may be adequately aligned so as to form reliable electrical contacts, e.g., aligned pad pairs 9a. Because the die growth is amplified at the peripheral portions (including at diagonally-oriented positions of the wafer) 31, pad pairs 9a in the inner portion 30 may experience little or no misalignment. In the illustration of FIG. 2A, the pad pairs 9a, 9b are spaced apart by approximately 13 mm diagonally on the bonded structure. It should be appreciated that the inner portion 30 shown herein may be closer to a geometric center of the bonded structure 1 (and/or geometric centers of the first and second elements 2, 3) than the peripheral portion 31. The peripheral portion 31 can be closer to outer edge(s) of the elements 2, 3 than the inner portion 30.

Accordingly, it can be important to predict the amount of warpage due to thickness differentials between the first and second elements 2, 3, and to control and/or compensate for this warpage in order to ensure electrical connectivity across the bonded structure 1. For example, the skilled artisan can use the Stoney equation to model the warpage in the second element 3 due to residual stresses in the layer 5b, accounting for the final thickness of the second element 3 after thinning. As explained above, analytical or numerical models and/or experimentation can be used to account for, e.g., wafer or die thickness, bond energy, bond initiation force, and other factors to provide an estimate of the degree of stretching of the second element 3 in singulated form.

Thus, in various embodiments, the amount of warpage of the second element 3' in wafer form can be determined based on a number of factors as explained above. Based on the amount of warpage of the second element 3' in wafer form, the runout of the second element 3 in singulated form (e.g., as a die) can be determined. Based on the estimated runout, the misalignment distances d between opposing pads 4a, 4b of the bonded structure 1 can be determined. Without compensating for this runout, as explained above, misaligned pad pairs 9b may not form electrical connections.

Various embodiments disclosed herein compensate for contact pad misalignment that results from differential expansion of the first and second semiconductor elements 2, 3 due to their differential thicknesses (e.g., T2 being different from T1). Beneficially, various embodiments can compensate for these misalignments during wafer fabrication of the first or second elements 2', 3' in wafer form. For example, in some embodiments, a lithographic magnification correction factor F can be derived from the differential expansion of the first and second semiconductor elements 2, 3 due to the differential thicknesses. The lithographic magnification correction factor F can comprise a scale factor by which the magnification of the lithographic system can be adjusted when performing lithography on the first or second element 2', 3'. Beneficially, the magnification can be adjusted during lithography without modifying any hardware. In other embodiments, the lithographic magnification correction factor F can be implemented by creating a new mask for the first or second element 2, 3 that compensates for the runout and misalignment. The correction factor F may be for the bonding surface only, or for a plurality of (e.g., 2-3) layers near the bonding surface, depending on the magnitude of change sought for the particular pair (e.g., a 200 micron die bonding to a 725 micron thick wafer may only utilize lithographic compensation in the bonding layer, whereas a 25 micron die bonding to a 725 micron thick wafer will have more runout and may utilize compensation in multiple (e.g., 2-3) metal layers.

Once the lithographic magnification correction factor F has been determined based on the final die thicknesses and materials stack, the first element 2' or the second element 3' in wafer form can be patterned with the lithography process, using appropriate magnification based on the determined lithographic magnification correction factor F. In some embodiments, the lithographic magnification correction factor F can be applied to the first element 2', but not the second element 3'. In such embodiments, the lithographic magnification correction factor F can serve to enlarge the pads 4a and pitches p of the singulated first element 2 by the lithographic magnification correction factor F to align with the pads 4b of the stretched second element 3 during bonding. In other embodiments, the lithographic magnification correction factor F can be applied to the second element 3', but not the first element 2'. In such embodiments, the lithographic magnification correction factor F can serve to shrink the pads 4b and pitches p of the second element 3' in wafer form by the lithographic magnification correction factor F such that, after thinning, the stretching of the pads 4b and pitches p of the second element 3 will expand by the determined amount to align with the pads 4a of the unmodified first element 2.

Accordingly, in various embodiments, a plurality of first contact pads 4a (also referred to herein as contact features) can be patterned on the first semiconductor element 2' in wafer form. A plurality of second contact pads 4b can be patterned on the second semiconductor element 3' in wafer form. To compensate for the differential expansion due to different thicknesses, the lithographic magnification correction factor F can be applied to one of the first patterning of the first element 2' and the second patterning of the second element 3' without applying the lithographic magnification correction factor to the other of the first patterning and the second patterning. It should be appreciated that, although the lithographic magnification correction factor F is only applied to one element and not the other element, other scaling or correction factors may be applied to the patterning of the first and/or second elements 2', 3' based on other factors. In some embodiments, respective corrective magnification factors F can be applied to both elements 2', 3' to compensate for differential expansion. As an example, a first correction factor F can be applied to the patterning of the first element 2' as a first partial compensation and a second correction factor F can be applied to the patterning of the second element 3' as a second partial compensation. The first partial compensation can serve to enlarge the features of the first element 2', and the second partial compensation can serve to shrink the features of the second element 3' such that the combined effect of the first and second partial compensations is that the pads 4a, 4b are aligned when bonded. Accordingly, the lithographic magnification correction factor F described here can serve as a modification factor that applied to the first and/or second elements 2', 3' that modifies the pattern of that element to compensate for differential thicknesses.

After the elements 2', 3' in wafer form have been patterned and suitably processed, the second element 3' can be thinned to the second thickness T2, for example, by etching, grinding, etc. The first element 2' may or may not be thinned to the first thickness T1, which is greater than the second thickness T2. The second element 3' in wafer form may then be singulated into a plurality of singulated second elements 3 (e.g., device dies). The first element 2' may also be singulated in some embodiments, or may remain in wafer form. As used herein, the first element 2 is shown as being a singulated element, but it should be appreciated that the first element 2 may instead remain in wafer form.

It should be appreciated that, in some embodiments, multiple elements (in addition to the second element 3) may be mounted and directly bonded to the first element 2. For example, additional semiconductor elements (e.g., dies) may be laterally spaced apart along the first element 2. In such embodiments, additional correction factor(s) F can be applied to one of the additional elements and the first element 2. The additional correction factor(s) F can be different from the correction factor F applied to the bonding of the first and second elements 2, 3. Additionally or alternatively, one or more additional semiconductor elements can be mound and/or directly bonded on the second semiconductor element 3. In such embodiments, a correction factor F can be applied to one of the additional elements and the second element 3. The correction factors F may be different for the different elements.

Figure 2C:
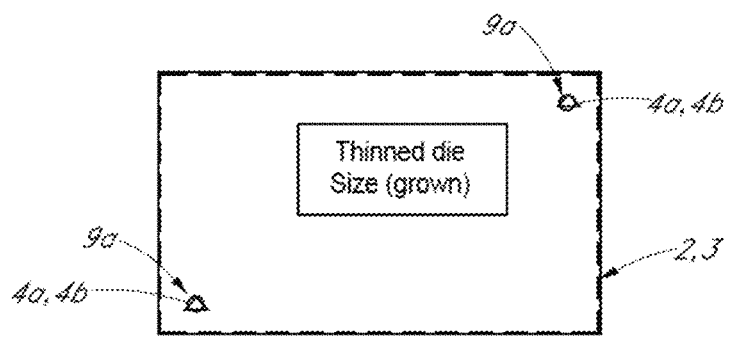
FIG. 2C is a top plan view showing a bonded structure after applying a lithographic magnification correction factor to a first element in wafer form.
Figure 2D:
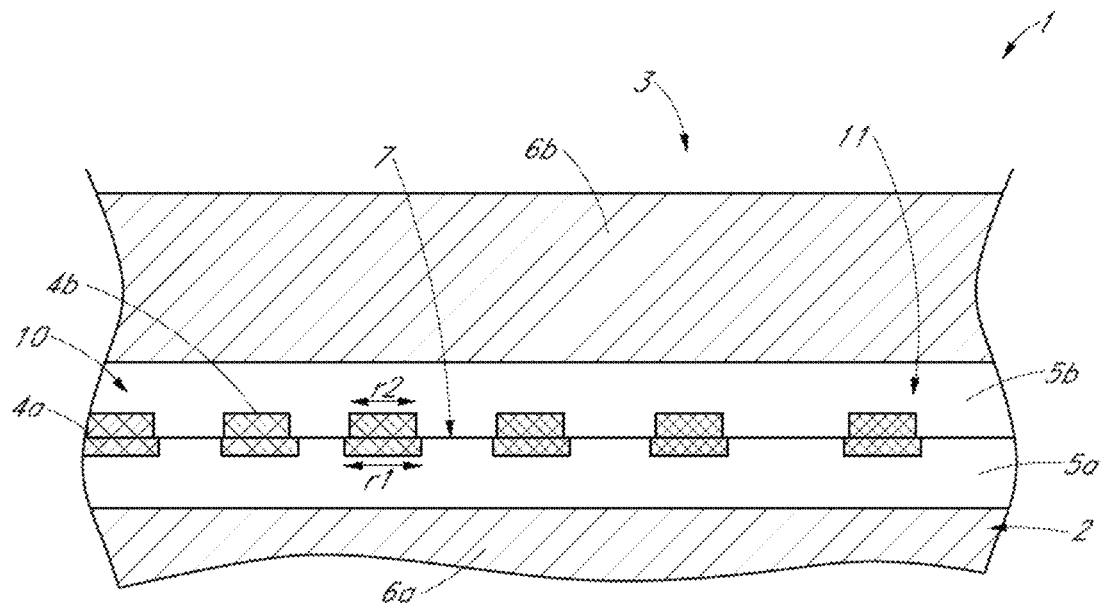
FIG. 2D is an enlarged, side sectional view of a portion of the bonded structure of FIG. 2C.

As a result of applying the lithographic magnification correction factor F to the first or second element 2, 3, the contact pads 4a, 4b of the bonded structure 1 may be aligned such that there is electrical connectivity across the bonded structure. FIG. 2C is a top plan view showing a bonded structure 1 after applying the lithographic magnification correction factor F to the first element 2' in wafer form. FIG. 2D is an enlarged, side sectional view of a portion of the bonded structure 1 of FIG. 2C. As shown in FIG. 2C, the use of the lithographic magnification correction factor F can beneficially reduce or eliminate misalignment between opposing contact pads 4a, 4b, such that all or substantially all contact pads 4a, 4b form aligned pad pairs 9a. In the illustrated embodiment, because the lithographic magnification correction factor F was applied to the first element 2', in this example, the contact features (e.g., the contact pads 4a and spacings between adjacent pads, or pitch p) of the first element 2 are accordingly enlarged such that pads 4a, 4b at the peripheral portion 31 are aligned and make direct contact. As shown, for example, the pads 4a of the first element 2 may be larger than the opposing pads 4b of the second element 3 by an amount proportional to the lithographic magnification correction factor F. However, since the lithographic magnification correction factor F provides for small modifications to the patterning, the first pads 4a may be only slightly larger than the second pads 4b of the second element 3. For example, in various embodiments, a first width r1 of the contact pad 4a can be no more than 10% larger than a second width r2 of the opposing contact pad 4b. In some embodiments, the first width r1 of the contact pad 4a can be no more than 5% larger than, or no more than 1% larger than, the second width r2 of the contact pad 4b.

In FIGS. 2C-2D, the lithographic magnification correction factor F was applied to the first element 2, which results in the expansion of the pad sizes and spacings between pads in order to align the pads 4a with the pads 4b of the stretched second element 3. In other embodiments, however, the lithographic magnification correction factor F can instead be applied to the second element 3'. In such an embodiment, the patterning would accordingly shrink the contact pads 4b and spacings between adjacent pads of the second element 3.

In various embodiments, the contact pads 4a of the first semiconductor element 2 can have generally uniform feature sizes, and contact pads 4b of the second semiconductor element 3 can have generally uniform feature sizes. In various embodiments, the pitches p of the pads 4a, 4b can be generally uniform. In various embodiments, each of the first and second pluralities of contact pads 4a, 4b can have at least two contact pads 4a or 4b that are of different size and/or shape.

Figures 3A, 3B:
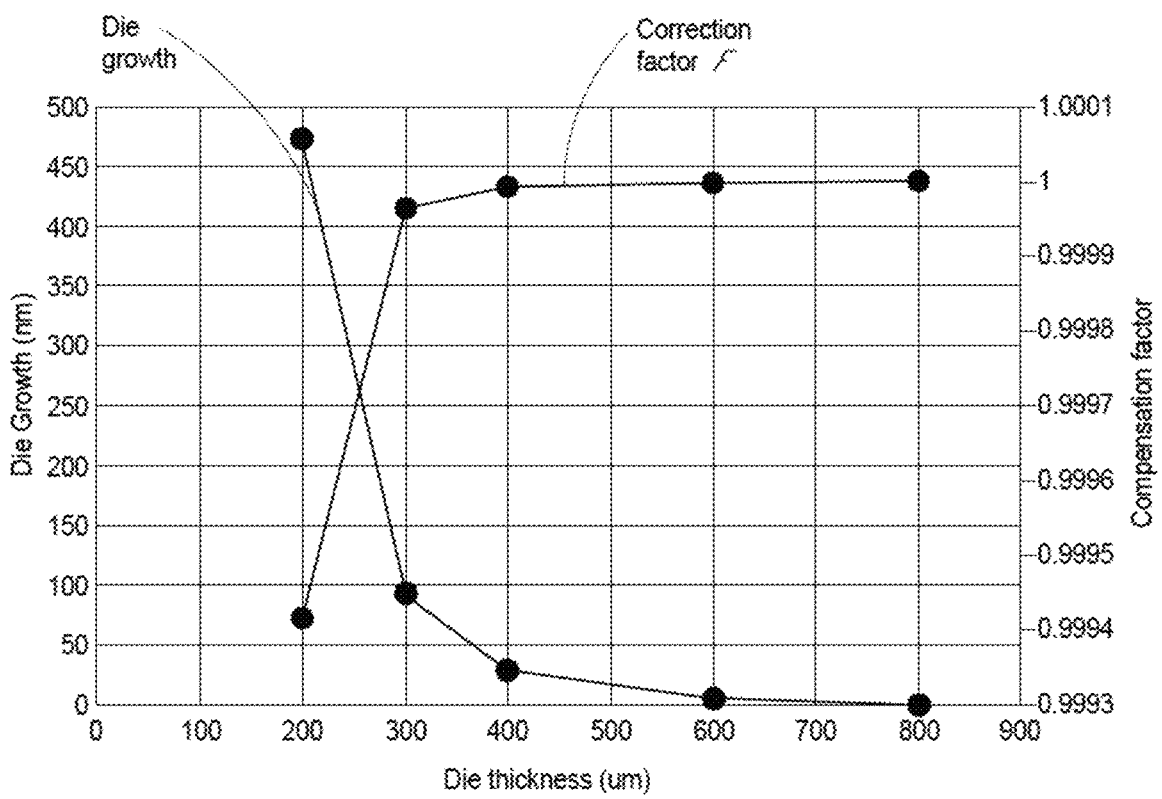
FIG. 3A is a table showing example lithographic magnification correction factors to be applied to the second element for different thicknesses of the second element after thinning.
FIG. 3B is a plot illustrating the correction factors and die growth amounts based on the data in FIG. 3A.

FIG. 3A is a table showing example lithographic magnification correction factors F to be applied to the second element 3' for different thicknesses T2 of the second element 3 after thinning. FIG. 3B is a plot illustrating the correction factors F and die growth amounts based on the data in FIG. 3A with an assumed wafer bow of 80 microns over a 300 mm wafer radius prior to thinning (e.g., 800 micron thickness). As shown in FIG. 3B, the growth of the second element 3 increases substantially at thicknesses T2 that are less than 400 microns, or less than 300 microns. As explained above, analytical or numerical models and/or experimentation can be used to determine the correction factors F for each die thickness T2 to compensate for the corresponding die growth or runout. When the correction factors F are applied to the second element 3', as explained above, the patterning of the second element 3 is shrunk so that pads 4b and spacings therebetween likewise shrink to align with the pads 4a. Therefore, as shown in FIGS. 3A and 3B, the correction factors F can be less than 1 for die thicknesses T2 less than 800 microns. Because more compensation is used for thinner elements 3, the correction factor F (and correspondingly the magnification) is lower as compared to thicker dies. Thus, the patterning of the second element 3' in wafer form can be shrunk by an amount approximately equal to the correction factor F as measured on the wafer prior to singulation (e.g., a 200 micron thick die will be approximately 99.942% of its specified size on the wafer prior to singulation).

Figures 3C, 3D:
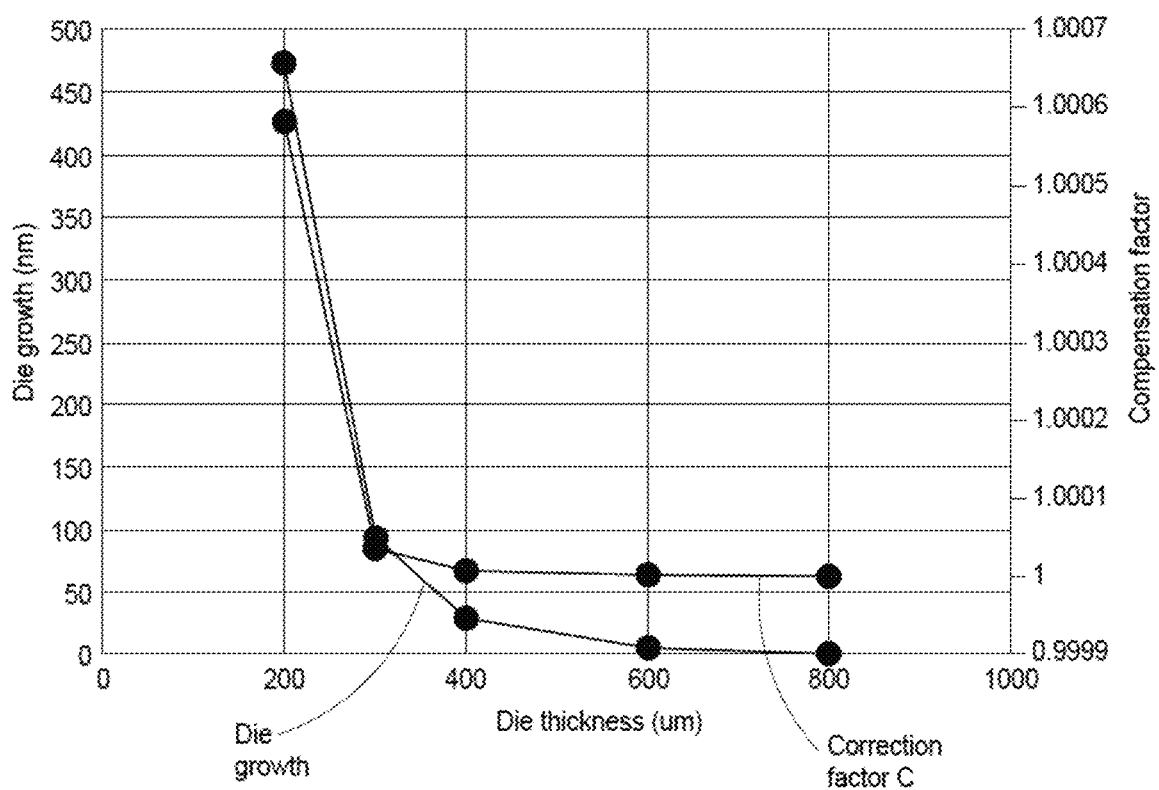
FIG. 3C is a table showing example lithographic magnification correction factors to be applied to the first element for different thicknesses of the first element.
FIG. 3D is a plot illustrating the correction factors and die growth amounts based on the data in FIG. 3C.

FIG. 3C is a table showing example lithographic magnification correction factors F to be applied to the first element 2' for different thicknesses T1 of the first element 2. FIG. 3D is a plot illustrating the correction factors F and die growth amounts based on the data in FIG. 3C. When the correction factors F are applied to the first element 2', as explained above, the patterning of the first element 2 is enlarged so that pads 4a and spacings therebetween likewise enlarge to align with the pads 4b. Therefore, as shown in FIGS. 3C and 3D, the correction factors F can be greater than 1 for die thicknesses T2 (of the second element 3) that are less than 800 microns. Because more compensation is used for thinner elements 3, the correction factor F (and correspondingly the magnification) is higher as compared to thicker dies. Thus, the patterning of the first element 2' in wafer form can be enlarged by an amount approximately equal to the correction factor F as measured on the wafer prior to singulation (e.g., a 200 micron thick die will be approximately 100.058% of its specified size on the wafer prior to singulation).

Figure 3E:
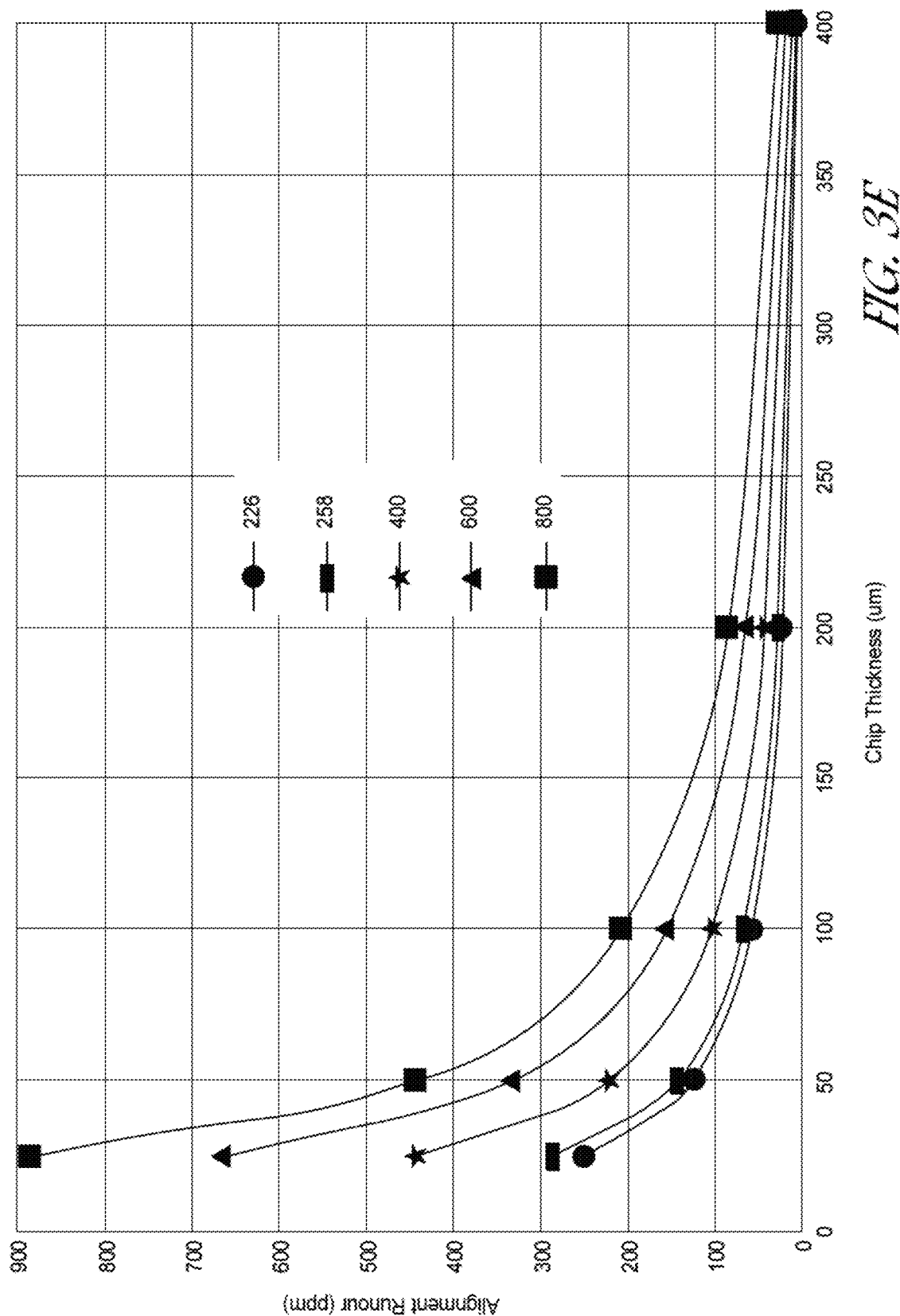
FIG. 3E is a plot showing alignment runout for different chip thicknesses of the second element for different values of stress in the bonding layer.
Figure 3F:
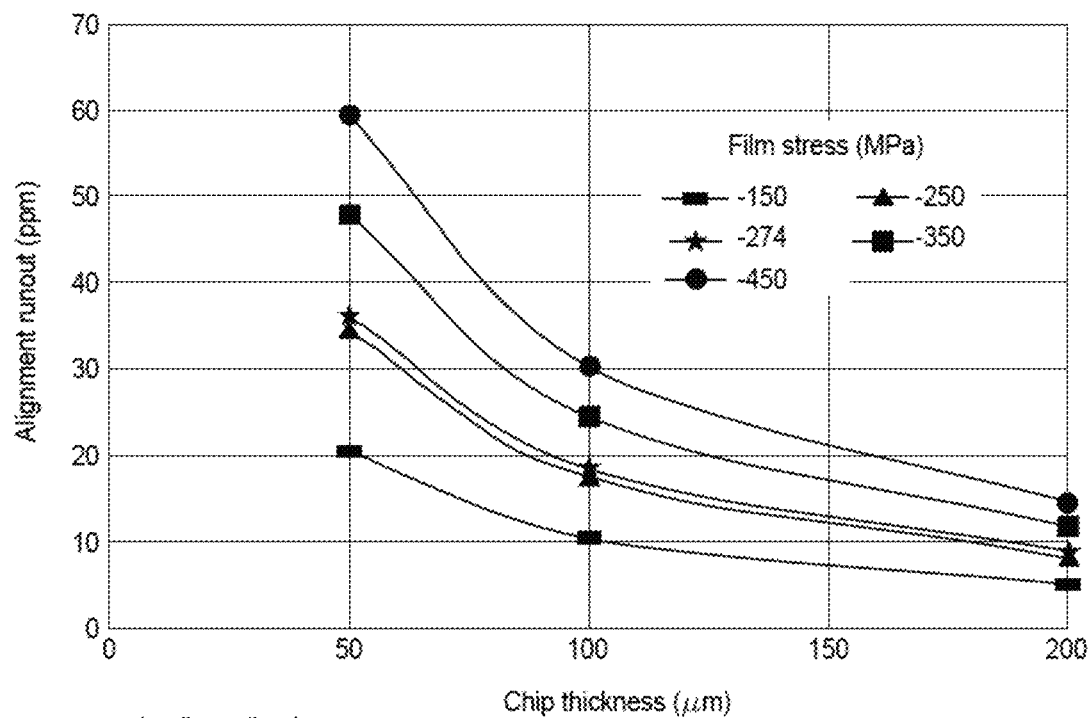
FIG. 3F is a plot showing alignment runout for different chip thicknesses of the second element for different values of stress in the bonding layer, when the second element is free to warp.
Figure 3G:
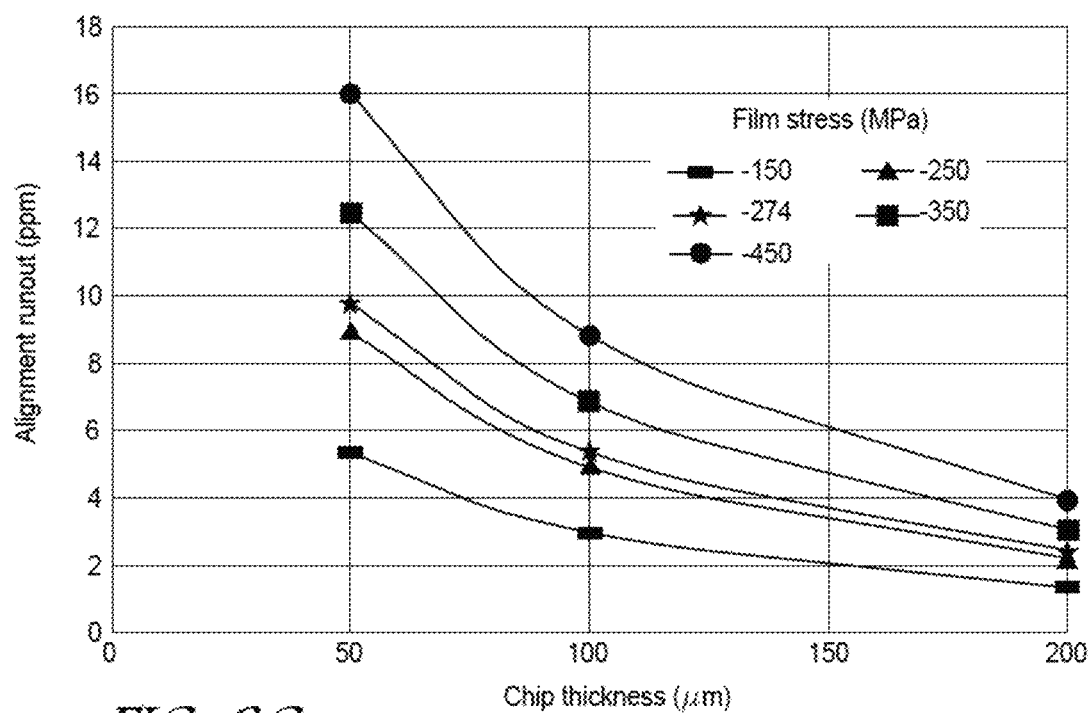
FIG. 3G is a plot showing alignment runout for different chip thicknesses of the second element for different values of stress in the bonding layer, when the second element is held flat.

It should be further appreciated that the die bow is affected by not only the stress in the film (e.g., the bonding layer 5b), but also the thickness of the layer 5b. The combined effect of stress and thickness in the layer 5b can affect the magnitude of the wafer bow, which in turn determines the runout when the wafer is thinned and singulated. FIG. 3E is a plot showing alignment runout for different chip thicknesses of the second element 3 for different values of stress in a bonding layer 5b having a thickness of 1.5 microns, when the second element 3 is free to warp. FIG. 3F is a plot showing alignment runout for different chip thicknesses of the second element 3 for different values of stress in bonding layer 5b having a thickness of 0.3 microns, when the second element 3 is free to warp. FIG. 3G is a plot showing alignment runout for different chip thicknesses of the second element 3 for different values of stress in the bonding layer 5b having a thickness of 0.3 microns, when the second element 3 is held flat, e.g., for direct bonding. As shown, increasing the compressive stress in the layer 5b increases alignment runout, which is exacerbated at lower die thicknesses. Moreover, a comparison of the plot of FIG. 3E (1.5 micron thick layer 5b) with the plots of FIGS. 3F-3G (0.3 micron thick layer 5b), it can be seen that thicker bonding layers 5b can significantly increase the amount of die warpage due to residual stresses. The runout can be reduced when the element 2 is held flat for bonding. Further, experimentation indicates that, in addition to warpage caused by residual stresses, the element 2 can deform from forces imparted by the bonding tool and deformation caused by the bonding process.

Thus, in various embodiments, the lithographic magnification correction factor F can be determined by experimental measurement and/or analytical or numerical models. The correction factor F can be a function of die surface stress and die thickness T2. The factor F can apply a simple linear correction without requiring modifications to hardware systems. The disclosed embodiments are well-suited for single-sided die with manageable die bow after thinning and singulation. However, if the die warpage is too high for direct hybrid bonding, then as explained below, a differential expansion compensation structure 40 can be provided in or on the second element 3. As explained below, the differential expansion compensation structures 40 may comprise one or multiple dielectric layers on the back side 15 of the element 3, or embedded in the element 3. To reduce pad misalignments, the lithographic magnification correction factor F can also compensate for the presence of additional structure from the differential expansion compensation structure (e.g., by experimentation and/or analytical or numerical modeling). For example, experimentation and/or modeling can account for any changes in runout caused by the presence of the differential expansion compensation structure 40.

Accordingly, as explained herein, the material stack (e.g., the combination of nonconductive and/or metallic layers) on both sides of the second element 3 can affect the amount of residual stress and, hence, the degree of warpage and runout in the element 3. The balance of the layers on each side of the semiconductor portion 6b, the materials of the layers, and the total thickness of the semiconductor or device portion 6b (e.g., silicon) may also affect the warpage and the degree of further correction. In some embodiments, the use of the lithographic correction factor F can be applied to the patterning of the first or second elements 2, 3 to substantially correct for misalignments. In such embodiments in which the correction factor F is sufficient to correct for misalignments, no separate differential expansion structure 40 may be provided. In other embodiments, the differential expansion structure 40 may sufficiently correct for misalignments, such that no lithographic correction factor F is applied to the patterning before bonding. In still other embodiments, the lithographic correction factor F can be applied to the first or second elements 2, 3, and a differential expansion structure 40 may also be used on the second element 3. In such embodiments, using a physical mechanism (such as the differential expansion structure 40) to physically reduce warpage in combination with a lithographic correction factor F can beneficially substantially reduce or eliminate runout and contact pad misalignment.

Figure 4A:
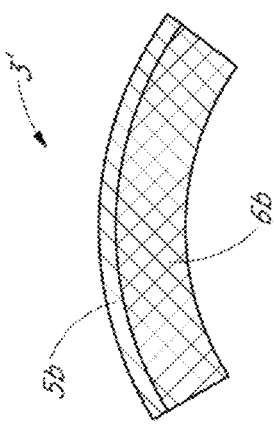
FIG. 4A is a schematic side view of a second element having a differential expansion compensation structure comprising one or multiple dielectric layers on the back side of the second semiconductor element.
Figure 4A:
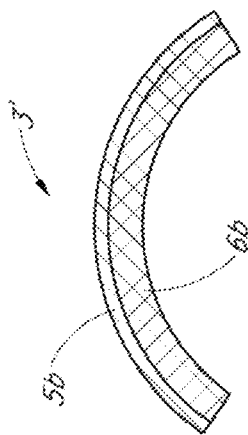
Figure 4A:
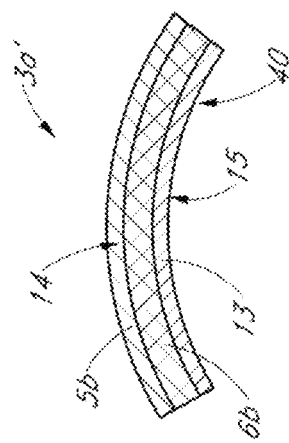
Figure 4B:
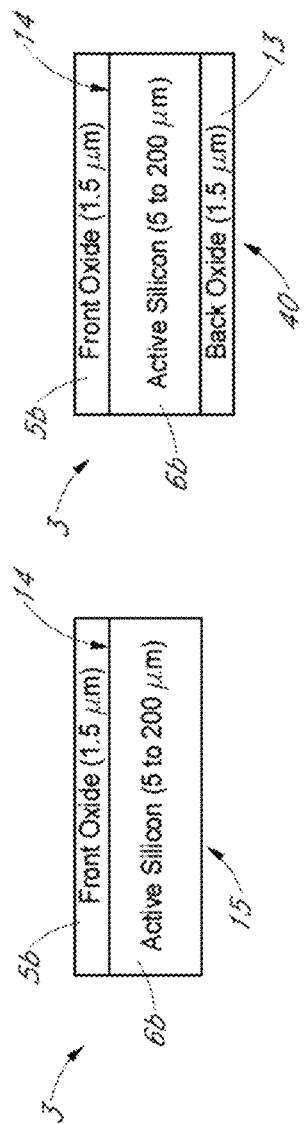
FIG. 4B is a plot comparing alignment runout for a second element with the differential expansion compensation structure and without the differential expansion compensation structure.
Figure 4B:
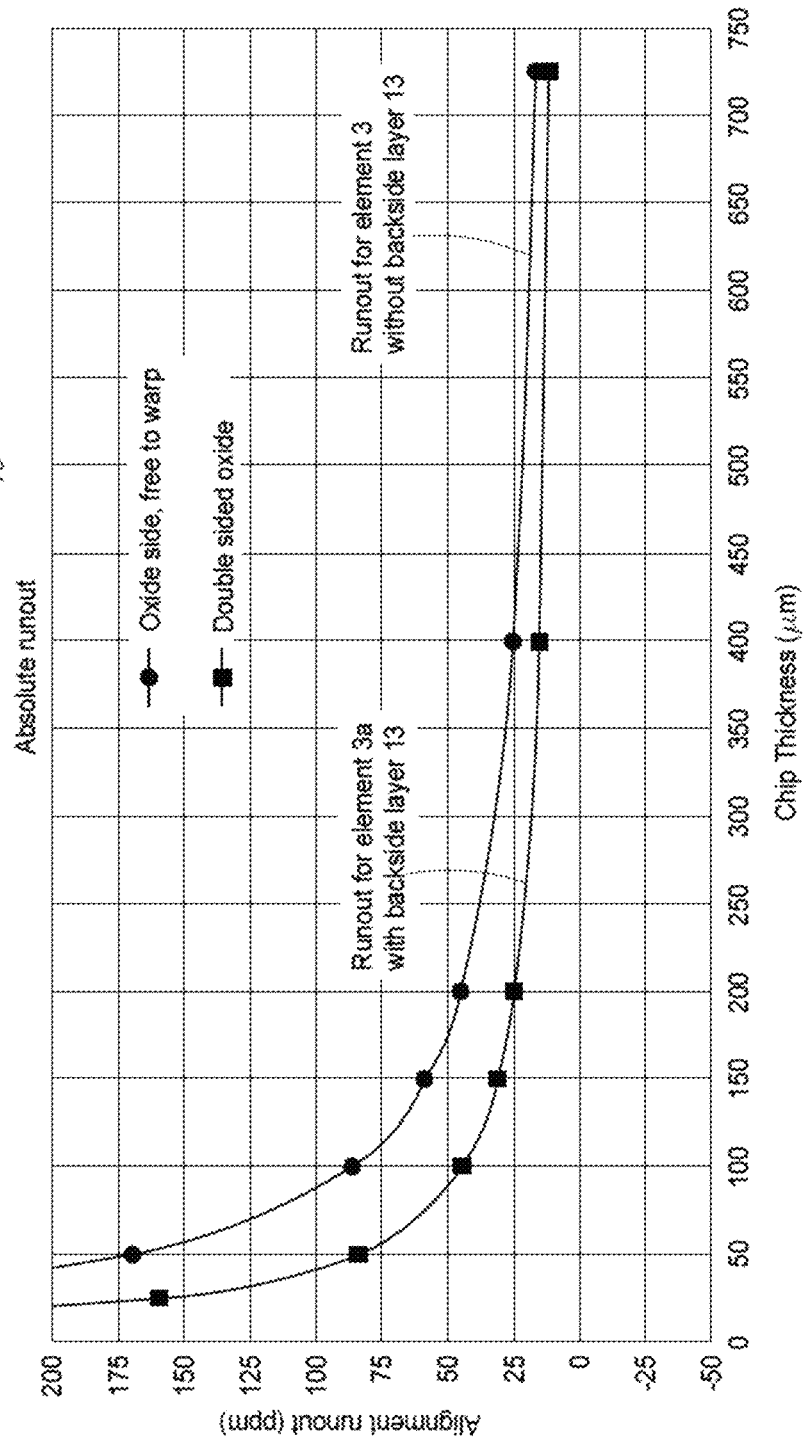

FIG. 4A is a schematic side view of a differential expansion compensation structure 40 comprising one or multiple dielectric layers 12 on the back side 15 of the second semiconductor element 3, 3'. FIG. 4B is a plot comparing alignment runout for a second element 3 with the differential expansion compensation structure 40 (upper left side) and without the differential expansion compensation structure 40 (upper right side). As shown in FIG. 4A, and as explained above in connection with FIG. 1C, after thinning the warpage and bowing of the second element 3' in wafer form can increase significantly. To reduce the bowing and corresponding alignment runout, one or more dielectric layers 13 can be provided (e.g., deposited) on the back side 15 of the second element 3'. To compensate for the stresses in the layer 5b, a stressed layer 13 (e.g., a compressive thin film) can be provided on the back side 15 and can be configured to counterbalance stresses in the layer 5b at or near the second bonding surface of the second element 3. For example, the thickness and composition of the layer 13 can be selected so as to reduce the warpage and runout significantly. In various embodiments, the layer 13 can comprise an inorganic dielectric or an organic dielectric. In some embodiments, for example, layer 13 can comprise an inorganic dielectric, such as silicon oxide or silicon nitride. As shown, the second element 3a' with the differential expansion compensation structure 40 can have a reduced amount of warping and bowing as compared to the wafer without the differential expansion compensation structure 40. Although one layer 13 is shown, it should be appreciated that, the layer 13 can comprise a plurality of dielectric layers in some embodiments. Further, the backside layer 13 can be provided before or after thinning. In some embodiments, some amount of silicon can be left on the back side to help control stress.

Further as shown in FIG. 4B, the absolute amount of alignment runout can be reduced appreciably for the element 3a with backside layer 13. For some elements 3a, the differential expansion compensation structure 40 may reduce the warpage such that the runout does not cause sufficient misalignment so as to prevent electrical connections between misaligned pads 4a, 4b. However, in some embodiments, although the differential expansion compensation structure 40 is effective in reducing runout and misalignment, it may be beneficial to additionally apply the lithographic magnification correction factor F to further reduce misalignment. In such embodiments, the correction factor F can be determined based on the element 3a with the backside dielectric layer 13 so that the correction factor F accounts for any changes in runout caused by the presence of the dielectric layer 13.

Figure 5:
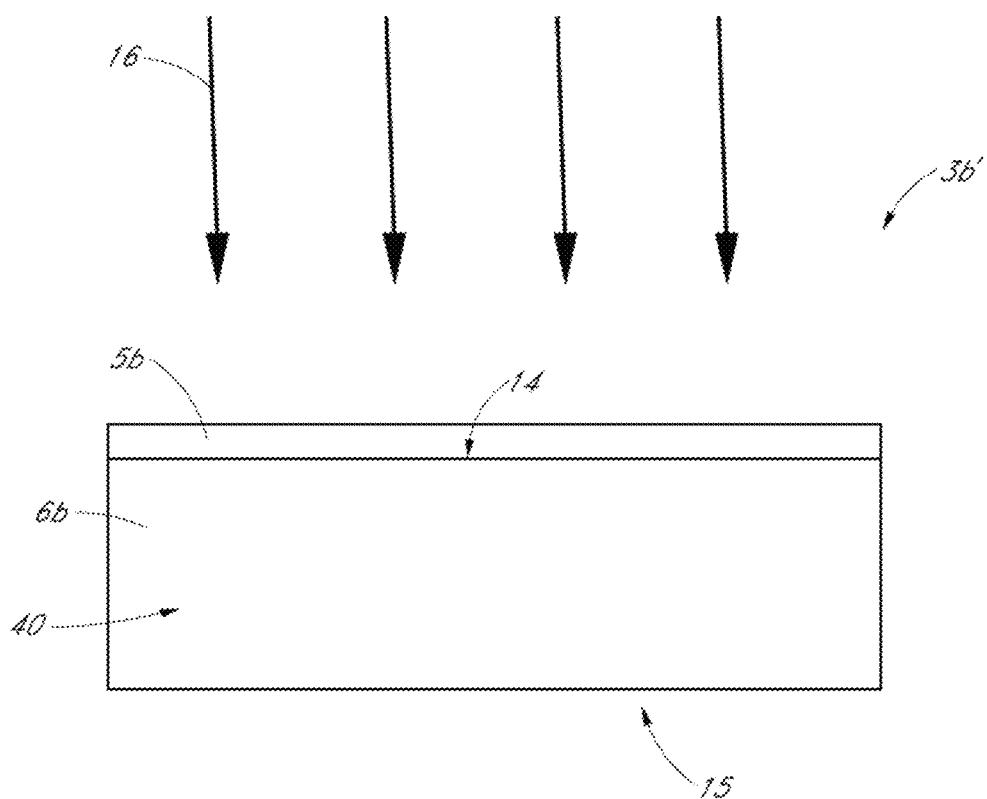
FIG. 5 illustrates another example of a method that reduces the warping and runout of the thinned second element.

FIG. 5 illustrates another example of a method that reduces the warping and runout of the thinned second element 3b'. As shown in FIG. 5, the front side of the second element 3b' (e.g., including the bonding layer 5b over the front side 14 of the portion 6b) can be exposed to a hydrogen plasma 16. In some embodiments, the back side 15 (or both sides) of the second element 3b' can be exposed to a hydrogen plasma 16. The hydrogen ions form the plasma 16 will diffuse through the layer 5b (or through the back side 15) into the semiconductor portion 6b to impart stress to the semiconductor portion 6b. The imparted stresses can balance the stresses in the layer 5b to reduce runout. As an example, a 50 micron thick wafer (e.g., second element 3' in wafer form) can be placed in a plasma chamber with the front side 14 facing upwardly. The element 3' can be exposed to the hydrogen plasma for a sufficient time (e.g., a few minutes) to diffuse hydrogen ions into the semiconductor portion 6b to flatten the element 3'. High mobility of hydrogen ions means that the hydrogen ions can diffuse rapidly through the layer 5b into the semiconductor portion 6b (e.g., silicon). The concentration of hydrogen in the element 3b' may vary between 0.005% to 10%, e.g., between 0.02% to 3%. After a direct bonding process, a vacuum oven may be used for the anneal that forms the bonded contacts, during which the hydrogen ions can be diffused out of the structure during thermal operation. In one embodiment, more that 95% of the hydrogen ions in the element 3b' may diffuse out of the element in less 15 minutes at 150° C. and $10^{-5}$ Torr. The higher the vacuum, the shorter the times for hydrogen ions to diffuse out from the element 3b'. If an ambient pressure oven is used, the bonded structure 1 can be treated in a vacuum oven to remove the hydrogen ions. Removing the hydrogen ions can reduce concerns about growing voids at the bond interface 7 due to hydrogen outgassing. The process may take less than an hour. In some embodiments, although the differential expansion compensation structure 40 is effective in reducing runout and misalignment, it may be beneficial to additionally apply the lithographic magnification correction factor F to further reduce misalignment. In such embodiments, the correction factor F can be determined based on the element 3b with a differential expansion compensation structure comprising a signature indicative of hydrogen ion diffusion so that the correction factor F accounts for any changes in runout caused by the diffusion of hydrogen ions. In one embodiment, the unsingulated element 3b' may be exposed to hydrogen ion radiation prior to the singulations step. In another embodiment, the singulated element 3b, for example on a dicing frame, may be exposed to hydrogen ion plasma or radiation to at least partial relax the stresses or to compensate for stress or the runout in element 3b before the bonding operation.

In various embodiments, the bonded structure 1 may include a signature indicative of the hydrogen diffusion process, e.g., the differential expansion compensation structure 40. For example, skilled artisans would understand that barrier layers may be provided before depositing damascene or non-damascene contact pads (e.g., copper pads) and when forming other conductive structures. The barrier layers can serve to prevent diffusion of the copper into the neighboring non-conductive material(s). For example, the barrier layer(s) can include materials such as titanium nitride, tantalum nitride, etc. In some barrier layer(s), the hydrogen from the plasma 16 may be adsorbed into the barrier layer(s). For example, for non-stoichiometric Ti- and Ta-based barrier layers, hydride may be present in the barrier layer(s) in the bonded structure 1. Accordingly, in various embodiments, the differential expansion compensation structure 40 can comprise a signature indicative of hydrogen ion presence in the barrier layer of the bonded element 3, 3' for example, as a result of the plasma 16.

Figure 6B:
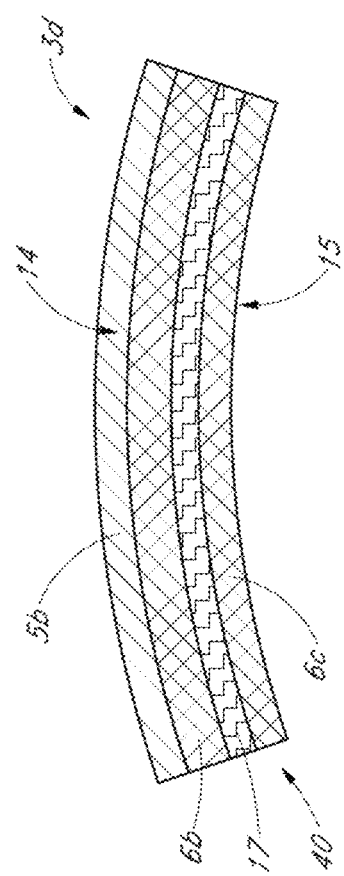
FIG. 6B is a schematic side view of the second element including the embedded dielectric layer after thinning and singulation.
Figure 6A:
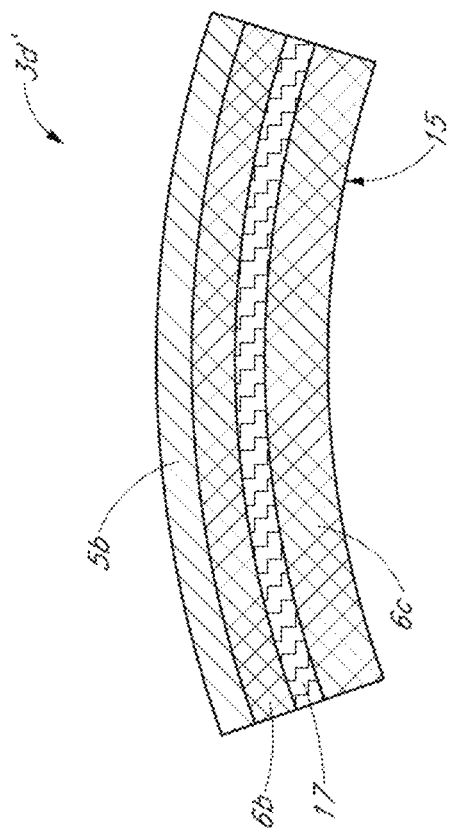
FIG. 6A is a schematic side view of the second element that includes a differential expansion compensation structure comprising an embedded dielectric layer disposed within the second element prior to thinning.

FIG. 6A is a schematic side view of the second element 3d' that includes a differential expansion compensation structure 40 comprising an embedded dielectric layer 17 disposed within the second element 3d' prior to thinning. FIG. 6B is a schematic side view of the second element 3d including the embedded dielectric layer 17 after thinning and singulation. As shown, embedding the dielectric layer 17 within the element 3d can reduce warpage or bowing (and according reduce the runout). In the embodiment of FIGS. 6A and 6B, a first dielectric layer can be provided on the back side 15 of the element 3d'. A second dielectric layer can be provided on a third semiconductor element that includes a third semiconductor or device portion 6c (such as silicon, polysilicon, or amorphous silicon). In some embodiments, the semiconductor portions 6b, 6c can comprise mirror polished silicon. In some embodiments, the first and second dielectric layers can comprise thermal oxide layers, which can are more economical than deposited layers. The first and second dielectric layers of the second and third semiconductor elements can be directly bonded to one another without an adhesive to form the dielectric layer 17. Thus, the first and second dielectric layers (which when bonded together form the dielectric layer 17) can be embedded between the semiconductor portion 6b of the second element 3' and the semiconductor portion 6c of the third element. The semiconductor portion 6c can be thinned to a desired thickness. The stress in the dielectric layer 17 can be tuned by modifying the thickness of the first and second layers before bonding and by selecting the position of the embedded layer 17 (which can comprise silicon oxide in some embodiments) relative to the top surface for transistor fabrication. In some embodiments, the second and third semiconductor elements can have different coefficients of thermal expansion. In other embodiments, the second and third semiconductor elements can have the same coefficient of thermal expansion. In some embodiments, the semiconductor portion 6c can comprise bulk silicon, amorphous silicon, or polysilicon.

The amount of alignment runout can be reduced appreciably for the element 3d with embedded layer 17. For some elements 3d, the differential expansion compensation structure 40 may reduce the warpage such that the runout does not cause sufficient misalignment so as to prevent electrical connections between misaligned pads 4a, 4b. In some embodiments, although the differential expansion compensation structure 40 is effective in reducing runout and misalignment, it may be beneficial to additionally apply the lithographic magnification correction factor F to further reduce misalignment. In such embodiments, the correction factor F can be determined based on the element 3d with the embedded dielectric layer 17 so that the correction factor F accounts for any changes in runout caused by the presence of the dielectric layer 17.

Turning to FIG. 6C, the second element 3e can comprise a compound semiconductor layer 19 fabricated on a carrier substrate layer 6c. The carrier substrate layer 6b can comprise a carrier dielectric layer 18, with the compound semiconductor layer disposed between the carrier dielectric layer 18 and the bonding layer 5b. As shown in FIG. 6C, a backside dielectric layer of the carrier substrate layer 6b can be directly bonded to a bonding surface of a third element having a semiconductor portion 6c. In some embodiments, a dielectric layer on the semiconductor portion 6c can be directly bonded to the backside dielectric layer of the carrier substrate layer 6b to form the embedded dielectric layer 17. The embedded dielectric layer 17 can serve as a differential expansion compensation structure 40. As explained above, although the differential expansion compensation structure 40 is effective in reducing runout and misalignment, it may be beneficial to additionally apply the lithographic magnification correction factor F to further reduce misalignment. In such embodiments, the correction factor F can be determined based on the element 3e with the embedded dielectric layer 17 so that the correction factor F accounts for any changes in runout caused by the presence of the dielectric layer 17 and/or the compound semiconductor layer 19.

Turning to FIG. 6D, the second element 3f can comprise a differential expansion compensation structure 40 comprising a metal layer 20 between first and second dielectric layers 17a, 17b. As shown in FIG. 6D, the first and second dielectric layers 17a, 17b and the metal layer 20 can be disposed between semiconductor portions 6b, 6c. The metal layer 20 can comprise any suitable metal. In various embodiments, the metal can be selected to withstand high device fabrication temperatures. In some embodiments, the metal layer 20 can comprise tungsten. In some embodiments, the metal layer 20 can serve as an electromagnetic shield. Thus, although the differential expansion compensation structure 40 is effective in reducing runout and misalignment, it may be beneficial to additionally apply the lithographic magnification correction factor F to further reduce misalignment. In such embodiments, the correction factor F can be determined based on the element 3f with the embedded metal layer 20 and dielectric layers 17a, 17b so that the correction factor F accounts for any changes in runout caused by the presence of the metal layer 20 and the dielectric layers 17a, 17b.

Figure 7A:
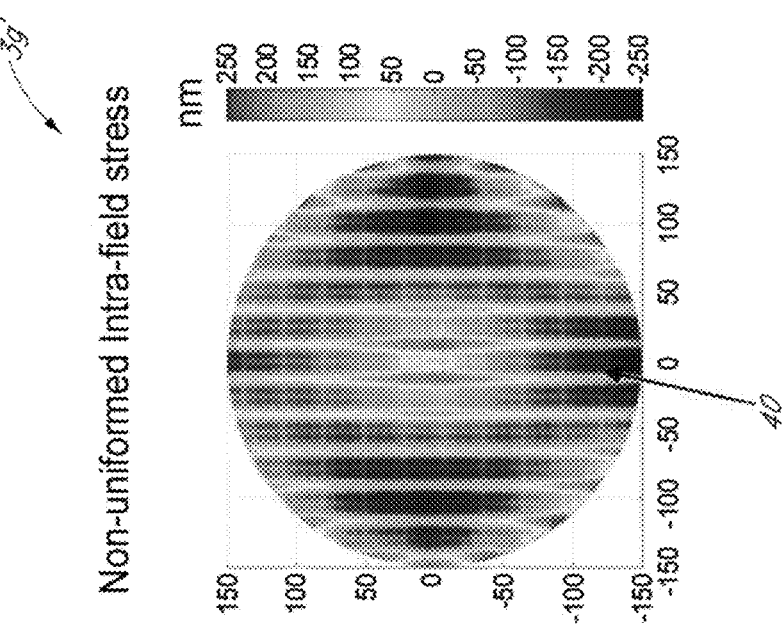
FIG. 7A illustrate stress modeling results for a second element including a differential expansion compensation structure comprising etch streets.
Figure 7A:
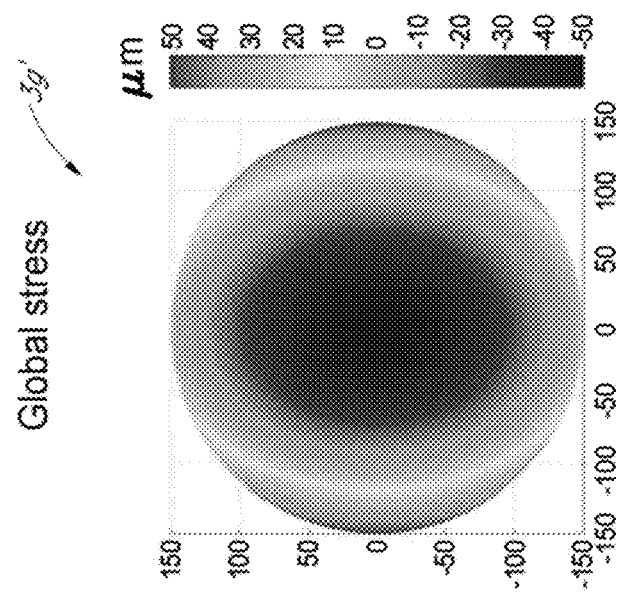
Figure 7A:
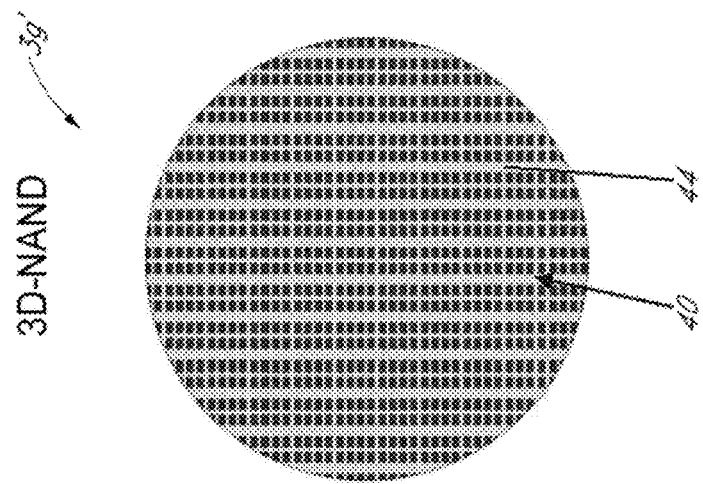

Turning to FIG. 7A, in some embodiments, the second element 3g' in wafer form can comprise a differential expansion compensation structure 40 comprises one or more dicing street etches 44. The dicing street etches 44 can be performed before direct bonding and can reduce bowing and warpage. In various embodiments, the correction factor F can be determined based on the presence of the dicing street etches 44.

Figure 7B:
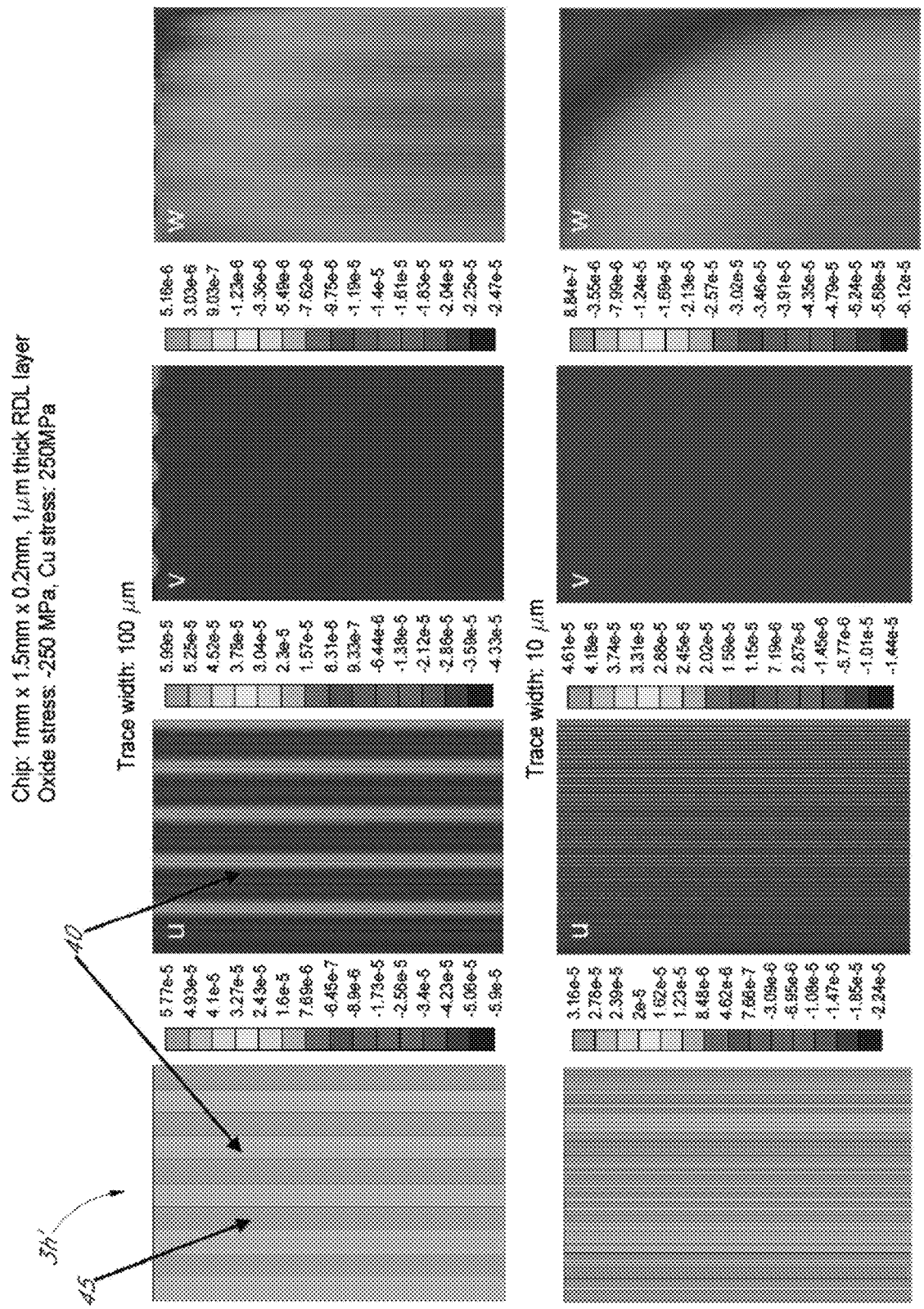
FIG. 7B illustrates stress modeling results for a second element including a differential expansion compensation structure comprising a patterned metal layer.

In FIG. 7B, the second element 3h' can comprise a differential expansion structure including a patterned metal layer 45 in the bonding layer 5b. The metal layer 45 can be patterned in strips or any other suitable pattern selected to reduce bowing or warpage. Numerical modeling indicates that tensile stresses in the metal layer 45 can be used to balance out the compressive stress in the bonding layer 5b to reduce warpage and runout. For example, for a bonding layer 5b with a 1.5 micron thick silicon oxide layer, the runout can be about 28 ppm. Incorporating a patterned metal layer 45 having alternating 10 micron oxide strips and 10 micron copper strips (assuming 250 MPa tensile stress and 1 micron thickness), the runout can be reduced to 2-3 ppm. In some embodiments, the overall distortion can be zero since the stress in the oxide and copper balance out. There can be a significant difference in using coarse versus fine redistribution layer (RDL) patternings. A coarse RDL patterning can have a higher variation within the oxide layer and copper strip because of the wider dimensions. The coarse pattern's non-uniformity can be higher than the fine pattern's non-uniformity. Ignoring edge effects, an overall edge distortion can be about 5-10 nm, which can cause a runout of about 2-3 ppm. However, there can be significant lower distortion in the range of 30-40 nm, which can cause runout of 10-12 ppm.

Figure 8:
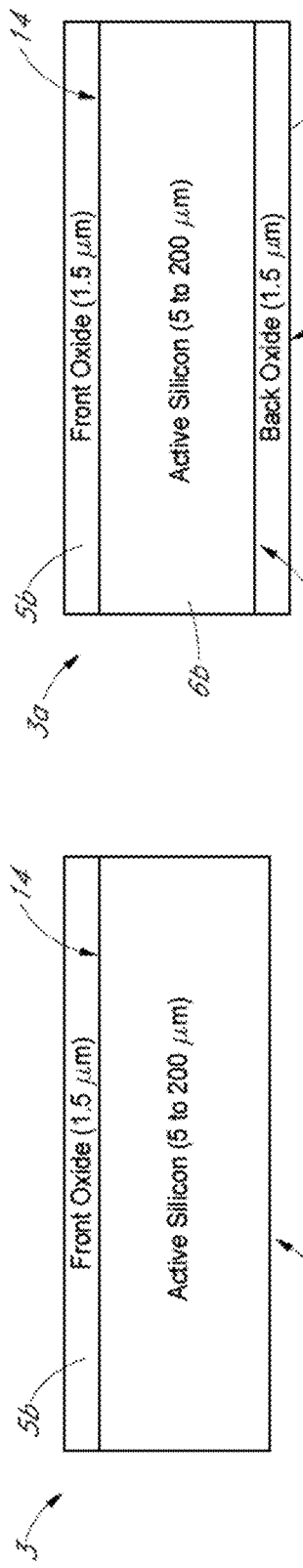
FIG. 8 illustrates plots comparing alignment runout for second elements when temperature control is performed during direct bonding.
Figure 8:
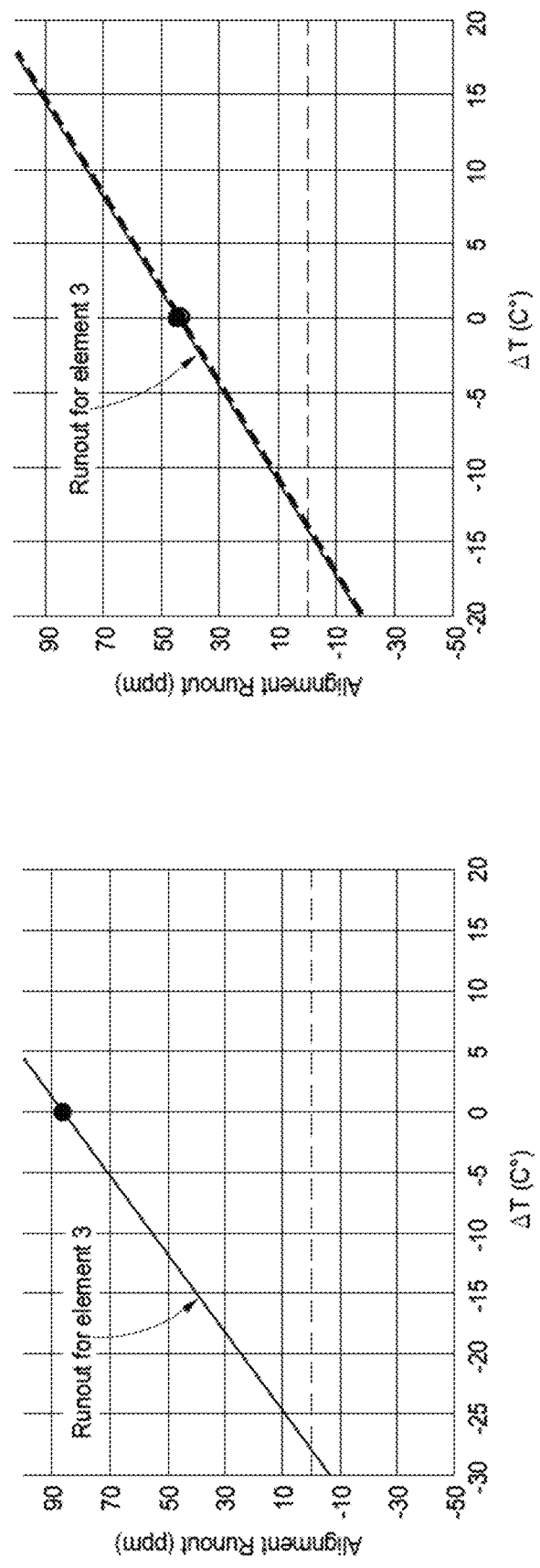

FIG. 8 illustrates plots comparing the alignment runout for the elements 3 and 3a when temperature control is performed during direct bonding. In some embodiments, the first and second elements 2, 3 can be maintained at different temperatures during direct bonding, which can reduce alignment runout in the second element 3. As shown in FIG. 8, a temperature difference of 0° C. for a 100 micron thick second element can produce a runout of more than 70 ppm for the second element 3 and more than 40 ppm for the second element 3a with the backside dielectric 13. The alignment runout can be reduced or eliminated by maintaining a small temperature difference between the elements 2, 3 during bonding. For example, for various chip thicknesses, boundary conditions (held flat or free to warp), and locations (top or bottom sides), the alignment runout as a function of temperature has a constant slop of about 3.15 ppm/° C. As an example, an alignment runout of 31.5 ppm can be compensated for by applying a temperature difference of −10° C. to the elements 2, 3.

Accordingly, various embodiments disclosed herein can utilize one or more of a lithographic magnification correction factor F and a differential expansion compensation structure 40 to compensate for thermal expansion and reduce misalignments between opposing contact pads 4a, 4b. For example, the use of the correction factor F and/or the compensation structure(s) 40 can ensure that at least 85%, at least 90%, at least 95%, or at least 99% of all contact pad pairs 9a in the bonded structure 1 are aligned and make electrical contact across the bond interface 7. As another example, in an uncompensated bonded structure, a radially-outermost misaligned pad pair 9b in the peripheral portion 31 may have an uncompensated center-to-center separation distance $d_{uc}$ due to thermal expansion and corresponding runout. Beneficially, the use of the correction factor F and/or the compensation structure 40 can reduce the separation distance d to a compensated separation distance $d_c$ to be within a range of 0% to 20%, 0% to 15%, 0% to 10%, 0% to 5%, 0.1% to 10%, 0.1% to 5%, or 0.5% to 5% of the uncompensated separation distance $d_{uc}$.

Figure 9:
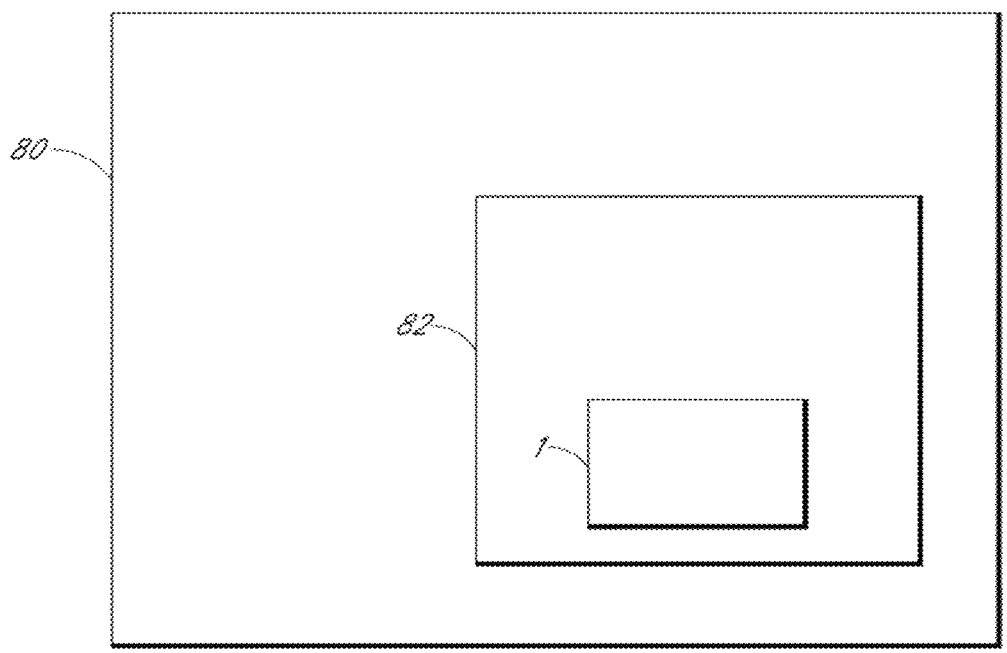
FIG. 9 is a schematic diagram of a system incorporating one or more microelectronic assemblies, according to various embodiments.

FIG. 9 is a schematic diagram of a system 80 incorporating one or more bonded structure 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The bonded structures 1 shown in FIG. 9 can comprise any of the bonded structure disclosed herein. The bonded structure 1 can include one or more integrated device dies which perform various functions for the system 80.

In one embodiment, a method of direct hybrid bonding first and second semiconductor elements of differential thickness is disclosed. The method can include: obtaining a lithographic magnification correction factor derived from differential expansion of the first and second semiconductor elements due to the differential thicknesses; first patterning a plurality of first contact features on the first semiconductor element; second patterning a plurality of second contact features on the second semiconductor element corresponding to the first contact features for direct hybrid bonding; and applying the lithographic magnification correction factor to one of the first patterning and second patterning without applying the lithographic magnification correction factor to the other of the first patterning and the second patterning. In some embodiments, the method comprises thinning the second semiconductor element to produce the differential thickness; and subsequently direct hybrid bonding the first semiconductor element to the second semiconductor element, including directly bonding nonconductive layers of the first and second semiconductor elements and directly bonding the first contact features with the corresponding second contact features. In some embodiments, the method comprises providing a differential expansion compensation structure on the second semiconductor element, the differential expansion compensation structure configured to compensate for differential expansion between the first and second semiconductor elements to reduce misalignment between opposing contact features. In some embodiments, providing the differential expansion compensation structure comprises providing one or more dielectric layers on a back side of the second semiconductor element, the back side opposite the second bonding surface. In some embodiments, the one or more dielectric layers comprises a compressive layer configured to counterbalance stresses on the nonconductive layer of the second semiconductor element. In some embodiments, the one or more dielectric layers comprises a plurality of dielectric layers. In some embodiments, the plurality of dielectric layers comprises a first dielectric layer on the back side of the second semiconductor element and a second dielectric layer on a third semiconductor element, and wherein providing the differential expansion compensation structure comprises directly bonding the second dielectric layer to the first dielectric layer without an adhesive. In some embodiments, the plurality of dielectric layers comprises a first dielectric layer and a second dielectric layer, and wherein providing the differential expansion compensation structure comprises providing a metal layer between the first and second dielectric layers. In some embodiments, providing the differential expansion compensation structure comprises diffusing hydrogen ions in the second semiconductor element. In some embodiments, the method comprises heating and applying a vacuum to the bonded first and second elements to remove the hydrogen ions. In some embodiments, diffusing hydrogen ions comprises exposing the second semiconductor element to a hydrogen-containing plasma. In some embodiments, providing the differential expansion compensation structure comprises patterning a metal layer in the nonconductive layer of at least one of the first and second semiconductor elements. In some embodiments, providing the differential expansion compensation structure comprises adjusting a temperature difference between the first semiconductor element and the second semiconductor element during the direct hybrid bonding. In some embodiments, the first semiconductor element is thicker than the second semiconductor element, the method comprising applying the lithographic magnification correction factor to the first patterning, wherein the application of the lithographic magnification correction factor enlarges the first contact features of the first semiconductor element relative to the corresponding second contact features of the second semiconductor element. In some embodiments, the application of the lithographic magnification correction factor enlarges first spacings between adjacent first contact features relative to corresponding second spacings between adjacent second contact features. In some embodiments, the first semiconductor element is thicker than the second semiconductor element, the method comprising applying the lithographic magnification correction factor to the second patterning, wherein the application of the lithographic magnification correction factor shrinks the second contact features of the second semiconductor element relative to the corresponding first contact features of the first semiconductor element. In some embodiments, the application of the lithographic magnification correction factor shrinks second spacings between adjacent second contact features relative to corresponding first spacings between adjacent first contact features. In some embodiments, the method comprises applying the lithographic magnification correction factor to the first patterning and applying a second lithographic magnification correction factor to the second patterning, the second lithographic magnification correction factor different from the lithographic magnification correction factor. In some embodiments, the method comprises applying the lithographic magnification correction to the first patterning, performing the first patterning with the first semiconductor element in wafer form, thinning the first semiconductor element, and singulating the first semiconductor element into a plurality of singulated semiconductor elements. In some embodiments, the method comprises direct hybrid bonding a third semiconductor element to the second semiconductor element, the third semiconductor element laterally spaced from the first semiconductor element and having a thickness different from the first semiconductor element. In some embodiments, the method comprises applying a second lithographic magnification correction factor to one of the second and third semiconductor elements, but not the other of the second and third semiconductor elements.

In another embodiment, a method of bonding a first semiconductor element and a second semiconductor element is disclosed. The method can include: providing a first semiconductor element; providing a second semiconductor element; obtaining a lithographic magnification correction factor to compensate for differential expansion between the first and second semiconductor elements if the first and second semiconductor elements are bonded together when the first semiconductor element has a first thickness and the second semiconductor element has a second thickness less than the first thickness; patterning a first plurality of first contact features on a first bonding surface of the first semiconductor element; patterning a second plurality of second contact pads on a second bonding surface of the second semiconductor element; and with the first semiconductor element having the first thickness and the second semiconductor element having the second thickness, bonding the second plurality of second contact pads to the first plurality of first contact pads; wherein the lithographic magnification correction factor is applied to one of but not the other of the patterning of the first and second contact features.

In some embodiments, the lithographic magnification correction is applied to the patterning of the first contact features, such that the first contact features are larger than corresponding second contact features. In some embodiments, the lithographic magnification correction is applied to the patterning of the second contact features, such that the second contact features are smaller than corresponding first contact features. In some embodiments, the bonding comprises directly bonding without an intervening adhesive. In some embodiments, the method comprises providing a differential expansion compensation structure on at least one of the first semiconductor element and the second semiconductor element, the differential expansion compensation structure configured to compensate for differential expansion between the first and second semiconductor elements to reduce misalignment between opposing contact features.

In another embodiment, a bonded structure is disclosed. The bonded structure can include: a first semiconductor element having a first bonding surface, the first bonding surface including a first contact feature at an inner portion of the first semiconductor element and a second contact feature spaced apart from the first contact feature at a peripheral portion of the first semiconductor element, the first element having a first thickness; and a second semiconductor element having a second bonding surface bonded to the first bonding surface of the first semiconductor element, the second bonding surface having a third contact feature at an inner portion of the second semiconductor element and a fourth contact feature spaced apart from the third contact feature at a peripheral portion of the second semiconductor element, the second semiconductor element having a second thickness, wherein the first contact feature is aligned with and bonded to the third contact feature, wherein the second contact feature is aligned with and bonded to the fourth contact feature, and wherein the first and second contact features are larger than the third and fourth contact features.

In some embodiments, a width of the first contact feature is no more than 10% larger than a width of the third contact feature. In some embodiments, a width of the first contact feature is no more than 5% larger than a width of the third contact feature. In some embodiments, a width of the first contact feature is no more than 1% larger than a width of the third contact feature. In some embodiments, prior to bonding, the first thickness is larger than the second thickness. In some embodiments, the first and second semiconductor elements are directly hybrid bonded to one another without an adhesive. In some embodiments, the first semiconductor element includes a first plurality of contact features having uniform feature sizes, and wherein the second semiconductor element includes a second plurality of contact features having uniform feature sizes. In some embodiments, the first and second pluralities of contact features have respective uniform pitches. In some embodiments, the first semiconductor element includes a first plurality of contact features, and wherein the second semiconductor element includes a second plurality of contact features, each of the first and second pluralities of contact features having at least two contact features that are of different size and/or shape. In some embodiments, the bonded structure can include a differential expansion compensation structure on at least one of the first and the second semiconductor elements, the differential expansion compensation structure configured to compensate for differential expansion between the first and second semiconductor elements to reduce misalignment between the second and fourth contact features. In some embodiments, the differential expansion compensation structure comprises one or more dielectric layers on a back side of the second semiconductor element, the back side opposite the second bonding surface. In some embodiments, the differential expansion compensation structure further comprises a third semiconductor element, wherein the one or more dielectric layers comprises a first dielectric layer on the back side of the second semiconductor element and a second dielectric layer on the third semiconductor element, the first and second dielectric layers directly bonded to one another without an adhesive. In some embodiments, the first and second dielectric layers are embedded between a first semiconductor portion of the second element and a second semiconductor portion of the third element. In some embodiments, the second element comprises a compound semiconductor layer on a carrier dielectric layer, the compound semiconductor layer disposed between the second bonding surface and the carrier dielectric layer. In some embodiments, the carrier dielectric layer is disposed on a carrier substrate layer, a backside dielectric layer of the carrier substrate layer being directly bonded to a bonding surface of a third element. In some embodiments, the one or more dielectric layers comprises a first dielectric layer and a second dielectric layer, the differential expansion compensation structure further comprising a metal layer between the first and second dielectric layers. In some embodiments, the differential expansion compensation structure comprises a signature indicative of hydrogen ion diffusion into the second semiconductor element. In some embodiments, the differential expansion compensation structure comprises a patterned metal layer on at least one of the first bonding surface and the second bonding surface.

In another embodiment, a bonded structure is disclosed. The bonded structure can include a first semiconductor element having a first bonding surface, the first bonding surface including a first contact feature at an inner portion of the first semiconductor element and a second contact feature at a peripheral portion of the first semiconductor element, the first element having a first thickness; a second semiconductor element having a second bonding surface bonded to the first bonding surface of the first semiconductor element, the second bonding surface having a third contact feature at an inner portion of the second semiconductor element and a fourth contact feature at a peripheral portion of the second semiconductor element, the second semiconductor element having a second thickness, wherein the first contact feature is bonded to the third contact feature, and wherein the second contact feature is bonded to the fourth contact feature; and a differential expansion compensation structure on at least one of the first and the second semiconductor elements, the differential expansion compensation structure configured to compensate for differential expansion between the first and second semiconductor elements to reduce misalignment between at least the second and fourth contact features.

In some embodiments, the second thickness is less than the first thickness at least before the first and second elements are bonded. In some embodiments, the first and second semiconductor elements are directly bonded without an intervening adhesive. In some embodiments, the differential expansion compensation structure comprises one or more dielectric layers on a back side of the second semiconductor element, the back side opposite the second bonding surface. In some embodiments, the one or more dielectric layers comprises a stressed layer configured to counterbalance stresses at or near the second bonding surface. In some embodiments, the one or more dielectric layers comprises a plurality of dielectric layers. In some embodiments, the differential expansion compensation structure further comprises a third semiconductor element, wherein the plurality of dielectric layers comprises a first dielectric layer on the back side of the second semiconductor element and a second dielectric layer on the third semiconductor element, the first and second dielectric layers directly bonded to one another without an adhesive. In some embodiments, the second and third semiconductor elements having different coefficients of thermal expansion. In some embodiments, the first and second dielectric layers are embedded between a first semiconductor portion of the second element and a second semiconductor portion of the third element. In some embodiments, the second element comprises a compound semiconductor layer on a carrier dielectric layer, the compound semiconductor layer disposed between the second bonding surface and the carrier dielectric layer. In some embodiments, the carrier dielectric layer is disposed on a carrier substrate layer, a backside dielectric layer of the carrier substrate layer being directly bonded to a bonding surface of a third element. In some embodiments, the plurality of dielectric layers comprises a first dielectric layer and a second dielectric layer, the differential expansion compensation structure further comprising a metal layer between the first and second dielectric layers. In some embodiments, the differential expansion compensation structure comprises one or more dicing street etches in at least one of the first and the second semiconductor elements. In some embodiments, the differential expansion compensation structure comprises a signature indicative of hydrogen ion diffusion into the second semiconductor element. In some embodiments, the differential expansion compensation structure comprises a patterned metal layer on at least one of the first bonding surface and the second bonding surface.

In another embodiment, a method of bonding a first element and a second element is disclosed. The method can include: providing a first semiconductor element having a first bonding surface, the first bonding surface including a first contact feature at an inner portion of the first semiconductor element and a second contact feature at a peripheral portion of the first semiconductor element, the first element having a first thickness; providing a second semiconductor element having a second bonding surface, the second bonding surface having a third contact feature at an inner portion of the second semiconductor element and a fourth contact feature at a peripheral portion of the second semiconductor element, the second semiconductor element having a second thickness less than the first thickness; bonding the first bonding surface to the second bonding surface such that the first contact feature is bonded to the third contact feature and the second contact feature is bonded to the fourth contact feature; and providing a differential expansion compensation structure on at least one of the first and second elements, the differential expansion compensation structure configured to compensate for differential expansion between the first and second semiconductor elements to reduce misalignment between at least the second and fourth contact features.

In some embodiments, the bonding comprises directly bonding without an intervening adhesive. In some embodiments, providing the differential expansion compensation structure comprises providing one or more dielectric layers on a back side of the second semiconductor element, the back side opposite the second bonding surface. In some embodiments, the one or more dielectric layers comprises a compressive layer configured to counterbalance stresses at or near the second bonding surface. In some embodiments, the one or more dielectric layers comprises a plurality of dielectric layers. In some embodiments, the plurality of dielectric layers comprises a first dielectric layer on the back side of the second semiconductor element and a second dielectric layer on a third semiconductor element, and wherein providing the differential expansion compensation structure comprises directly bonding the second dielectric layer to the first dielectric layer without an adhesive. In some embodiments, the plurality of dielectric layers comprises a first dielectric layer and a second dielectric layer, and wherein providing the differential expansion compensation structure comprises providing a metal layer between the first and second dielectric layers. In some embodiments, providing the differential expansion compensation structure comprises forming one or more dicing street etches in at least one of the first and the second semiconductor elements. In some embodiments, providing the differential expansion compensation structure comprises diffusing hydrogen ions into the second semiconductor element. In some embodiments, applying a vacuum to the bonded first and second elements to remove the hydrogen ions. In some embodiments, diffusing hydrogen ions comprises exposing the second element to a hydrogen-containing plasma. In some embodiments, providing the differential expansion compensation structure comprises patterning a metal layer on at least one of the first bonding surface and the second bonding surface. In some embodiments, providing the differential expansion compensation structure comprises adjusting a temperature difference between the first element and the second element during the bonding. In some embodiments, the method can include before the bonding, obtaining a lithographic magnification correction factor to compensate for differential expansion between the first and second semiconductor elements at their different thicknesses at the time of bonding; first patterning a first plurality of contact features on the first semiconductor element; second patterning a second plurality of contact features on the second semiconductor element; and applying the lithographic magnification correction factor to one of the first patterning and second patterning without applying the lithographic magnification correction factor to the other of the first patterning and the second patterning.

In another embodiment, a method of compensating for lithographic runout of an element is disclosed. The method can include: providing a first semiconductor element having a first bonding surface; and exposing the first semiconductor element to hydrogen ions to control the runout of the first semiconductor element.

In some embodiments, the first semiconductor element has a first bonding surface including a first contact feature at an inner portion of the first semiconductor element and a second contact feature at a peripheral portion of the first semiconductor element, the first element having a thickness smaller than a lateral dimension of the first semiconductor element. In some embodiments, exposing the first semiconductor element to hydrogen ions comprises exposing the first semiconductor element to a hydrogen plasma.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of direct hybrid bonding first and second semiconductor elements of differential thickness, the method comprising:
   providing a plurality of first contact features on the first semiconductor element with a first pattern;
   patterning a plurality of second contact features on the second semiconductor element with a second pattern, the second contact features corresponding to the first contact features; and
   direct hybrid bonding the first semiconductor element to the second semiconductor element, including directly bonding nonconductive layers of the first and second semiconductor elements and directly bonding the first contact features with the corresponding second contact features,
   wherein a lithographic magnification correction factor is applied to the second pattern without applying the lithographic magnification correction factor to the first pattern.

2. The method of claim 1, further comprising thinning the second semiconductor element to produce the differential thickness.

3. The method of claim 2, further comprising providing a differential expansion compensation structure on the second semiconductor element, the differential expansion compensation structure configured to compensate for differential expansion between the first and second semiconductor elements to reduce misalignment between opposing contact features.

4. The method of claim 3, wherein providing the differential expansion compensation structure comprises providing one or more dielectric layers on a back side of the second semiconductor element, the back side opposite the second bonding surface, the one or more dielectric layers comprising a compressive layer configured to counterbalance stresses on the nonconductive layer of the second semiconductor element.

5. The method of claim 3, wherein the differential expansion compensation structure comprises a plurality of dielectric layers, wherein the plurality of dielectric layers comprises a first dielectric layer on the back side of the second semiconductor element and a second dielectric layer on a third semiconductor element, and wherein providing the differential expansion compensation structure comprises directly bonding the second dielectric layer to the first dielectric layer without an adhesive.

6. The method of claim 3, wherein the differential expansion compensation structure comprises a plurality of dielectric layers, wherein the plurality of dielectric layers comprises a first dielectric layer and a second dielectric layer, and wherein providing the differential expansion compensation structure comprises providing a metal layer between the first and second dielectric layers.

7. The method of claim 3, wherein providing the differential expansion compensation structure comprises diffusing hydrogen ions in the second semiconductor element.

8. The method of claim 7, wherein diffusing hydrogen ions comprises exposing the second semiconductor element to a hydrogen-containing plasma.

9. The method of claim 1, wherein the first semiconductor element is thicker than the second semiconductor element, the method comprising applying the lithographic magnification correction factor to the first pattern, wherein the application of the lithographic magnification correction factor enlarges the first contact features of the first semiconductor element relative to the corresponding second contact features of the second semiconductor element, and wherein the application of the lithographic magnification correction factor enlarges first spacings between adjacent first contact features relative to corresponding second spacings between adjacent second contact features.

10. The method of claim 1, wherein the first semiconductor element is thicker than the second semiconductor element, the method comprising applying the lithographic magnification correction factor to the second pattern, wherein the application of the lithographic magnification correction factor shrinks the second contact features of the second semiconductor element relative to the corresponding first contact features of the first semiconductor element, and wherein the application of the lithographic magnification correction factor shrinks second spacings between adjacent second contact features relative to corresponding first spacings between adjacent first contact features.

11. The method of claim 1, further comprising applying the lithographic magnification correction factor to the first pattern and applying a second lithographic magnification correction factor to the second pattern, the second lithographic magnification correction factor different from the lithographic magnification correction factor.

12. A method of bonding a first semiconductor element and a second semiconductor element, the method comprising:
   providing a first plurality of first contact features on a first bonding surface of a first semiconductor element in a first pattern;
   providing a second plurality of second contact pads on a second bonding surface of a second semiconductor element in a second pattern;
   with the first semiconductor element having a first thickness and the second semiconductor element having a second thickness, hybrid bonding the second plurality of second contact pads to the first plurality of first contact pads;
   wherein a lithographic magnification correction factor is applied to the second pattern but not the first pattern.

13. The method of claim 12, wherein the bonding comprises directly bonding without an intervening adhesive.

14. The method of claim 12, further comprising providing a differential expansion compensation structure on at least one of the first semiconductor element and the second semiconductor element, the differential expansion compensation structure configured to compensate for differential expansion between the first and second semiconductor elements to reduce misalignment between opposing contact features.

15. The method of claim 1, wherein the lithographic magnification correction factor is configured to compensate for differential expansion of the first and second semiconductor elements due to the differential thicknesses.

16. The method of claim 1, further comprising obtaining the lithographic magnification correction factor.

17. The method of claim 16, further comprising deriving the lithographic magnification correction factor from differential expansion of the first and second semiconductor elements due to the differential thicknesses.

18. The method of claim 16, wherein the lithographic magnification correction factor is derived from differential expansion of the first and second semiconductor elements due to the differential thicknesses.

19. The method of claim 12, wherein the lithographic magnification correction factor is configured to compensate for differential expansion between the first and second semiconductor elements if the first and second semiconductor elements are bonded together when the second thickness is less than the first thickness.

20. The method of claim 12, wherein the first and second thicknesses are different.

* * * * *